(12) United States Patent
Chen et al.

(10) Patent No.: US 11,942,510 B2
(45) Date of Patent: *Mar. 26, 2024

(54) LIGHT-EMITTING DEVICE

(71) Applicant: EPISTAR CORPORATION, Hsinchu (TW)

(72) Inventors: Chao-Hsing Chen, Hsinchu (TW); Chi-Shiang Hsu, Hsinchu (TW); Yong-Yang Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/875,068

(22) Filed: Jul. 27, 2022

(65) Prior Publication Data

US 2022/0367562 A1 Nov. 17, 2022

Related U.S. Application Data

(63) Continuation of application No. 17/138,335, filed on Dec. 30, 2020, now Pat. No. 11,437,430.

(30) Foreign Application Priority Data

Dec. 31, 2019 (TW) ................................. 108148664

(51) Int. Cl.
*H01L 27/15* (2006.01)
(52) U.S. Cl.
CPC .................................. *H01L 27/156* (2013.01)
(58) Field of Classification Search
CPC ....... H01L 33/38; H01L 27/156; H01L 33/46; H01L 33/145; H01L 33/405; H01L 33/44; H01L 33/10
See application file for complete search history.

(56) References Cited

U.S. PATENT DOCUMENTS 11,437,430 B2 * 9/2022 Chen ..................... H01L 27/156
2016/0013388 A1 1/2016 Lee et al.
2018/0323236 A1 * 11/2018 Oh ........................ H01L 27/156

* cited by examiner

*Primary Examiner* — Changhyun Yi
(74) *Attorney, Agent, or Firm* — DITTHAVONG, STEINER & MLOTKOWSKI

(57) ABSTRACT

A light-emitting device comprises a substrate comprising a top surface; a plurality of light-emitting units formed on the top surface of the substrate comprising a first light-emitting unit, a second light-emitting unit, and one or a plurality of third light-emitting units, wherein each of the plurality of light-emitting units comprises a first semiconductor layer, an active layer and a second semiconductor layer; an insulating layer comprising a first insulating layer opening and a second insulating layer opening formed on each of the plurality of light-emitting units; a first extension electrode covering the first light-emitting unit, wherein the first extension electrode covers the first insulating layer opening on the first light-emitting unit without covering the second insulating layer opening on the first light-emitting unit; a second extension electrode covering the second light-emitting unit, wherein the second extension electrode covers the second insulating layer opening on the second light-emitting unit without covering the first insulating layer opening on the second light-emitting unit; a first electrode pad covering a part of the plurality of the light-emitting units; and a second electrode pad covering another part of the plurality of light-emitting units.

20 Claims, 12 Drawing Sheets

US 11,942,510 B2

LIGHT-EMITTING DEVICE

REFERENCE TO RELATED APPLICATION

This application is a continuation application of U.S. patent application Ser. No. 17/138,335, filed on Dec. 30, 2020, now pending, which claims the right of priority based on TW Application Serial No. 108148664, filed on Dec. 31, 2019, and the content of which is hereby incorporated by reference in its entirety.

TECHNICAL FIELD

The application relates to a light-emitting device, and more particularly, to a flip chip light-emitting device comprising a semiconductor stack, a first electrode pad and a second electrode pad formed on the same side of the semiconductor stack.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, the light-emitting diodes are widely used in the household appliances, the equipment indicators, and the optoelectronic products.

SUMMARY OF THE APPLICATION

The present application provides a light-emitting device to improve the light extraction efficiency of the light-emitting device.

The present application provides a light-emitting device to improve the structure reliability of the light-emitting device.

The present application provides a light-emitting device to reduce the failure probability of the light-emitting device due to the damage of the insulating layer.

In accordance with an embodiment of the present application, a light-emitting device comprises a substrate comprising a top surface; a plurality of light-emitting units formed on the top surface of the substrate comprising a first light-emitting unit, a second light-emitting unit, and one or a plurality of third light-emitting units, wherein each of the plurality of light-emitting units comprises a first semiconductor layer, an active layer and a second semiconductor layer; an insulating layer comprising a first insulating layer opening and a second insulating layer opening formed on each of the plurality of light-emitting units; a first extension electrode covering the first light-emitting unit, wherein the first extension electrode covers the first insulating layer opening on the first light-emitting unit without covering the second insulating layer opening on the first light-emitting unit; a second extension electrode covering the second light-emitting unit, wherein the second extension electrode covers the second insulating layer opening on the second light-emitting unit without covering the first insulating layer opening on the second light-emitting unit; a first electrode pad covering a part of the plurality of the light-emitting units; and a second electrode pad covering another part of the plurality of light-emitting units.

In accordance with an embodiment of the present application, a light-emitting device comprises a substrate comprising a top surface; a plurality of light-emitting units formed on the top surface of the substrate comprising a first light-emitting unit, a second light-emitting unit, and one or a plurality of third light-emitting units, wherein each of the plurality of light-emitting units comprises a first semiconductor layer, an active layer, and a second semiconductor layer; a first metal layer covering the first light-emitting unit and a part of the plurality of third light-emitting units; a second metal layer covering the second light-emitting unit and another part of the plurality of third light-emitting units, wherein the first metal layer and the second metal layer are electrically insulated from the plurality of light-emitting units; a first electrode pad covering a part of the plurality of light-emitting units; and a second electrode pad covering another part of the plurality of light-emitting units.

DETAILED DESCRIPTION OF PREFERRED EMBODIMENTS

Figure 1:
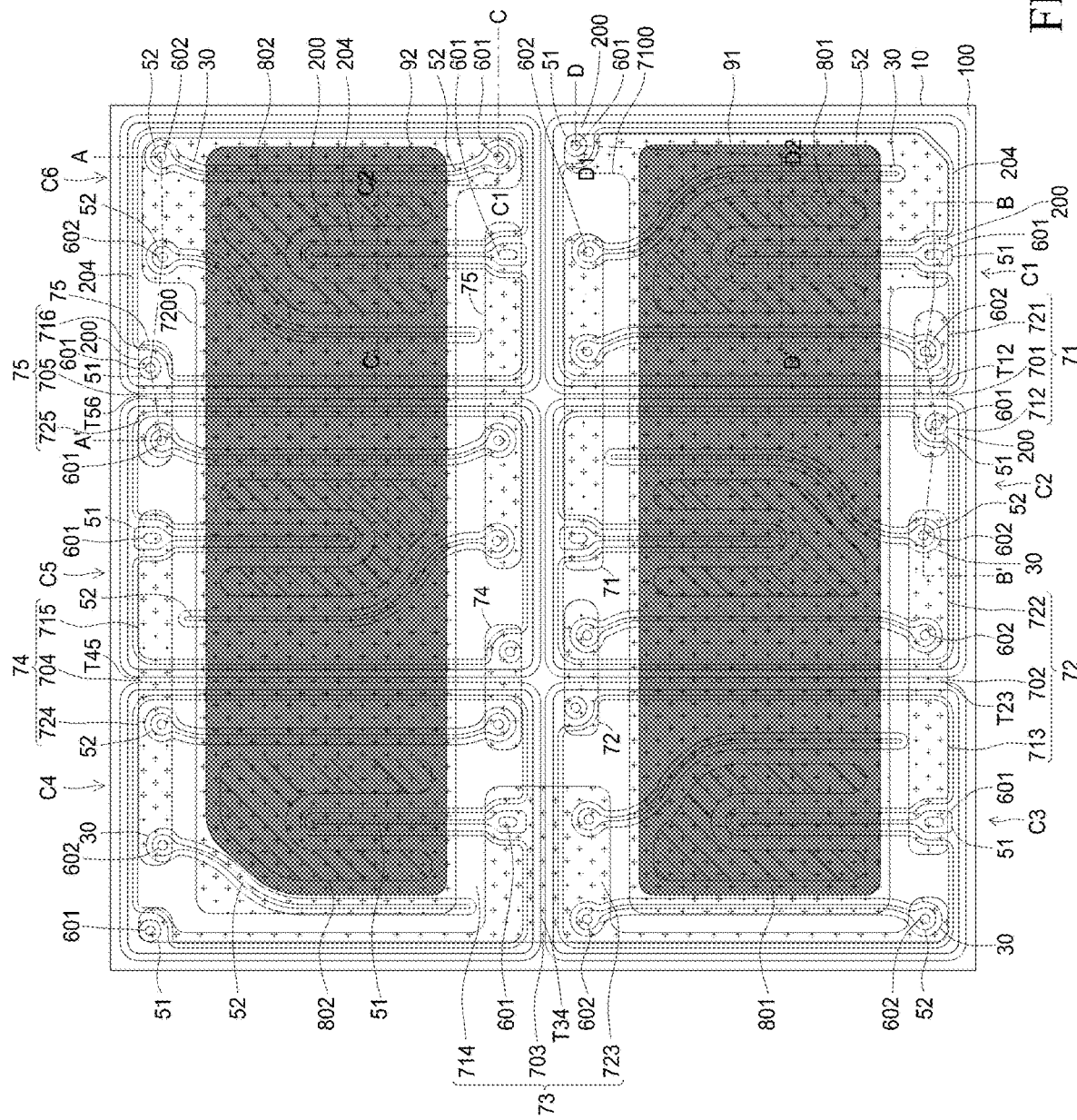
FIG. 1 illustrates a top view of a light-emitting device 1 in accordance with an embodiment of the present application.

The embodiment of the application is illustrated in detail, and is plotted in the drawings. The same or the similar part is illustrated in the drawings and the specification with the same number.

Figure 2:
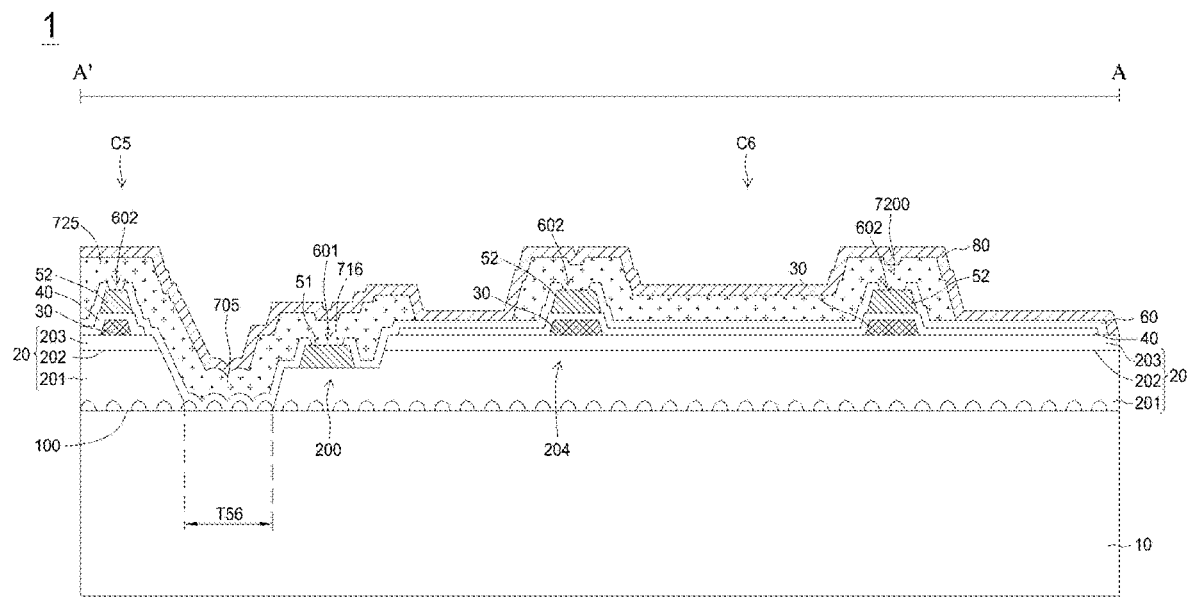
FIG. 2 illustrates a cross-sectional view taken along line A-A' of FIG. 1.
Figure 3:
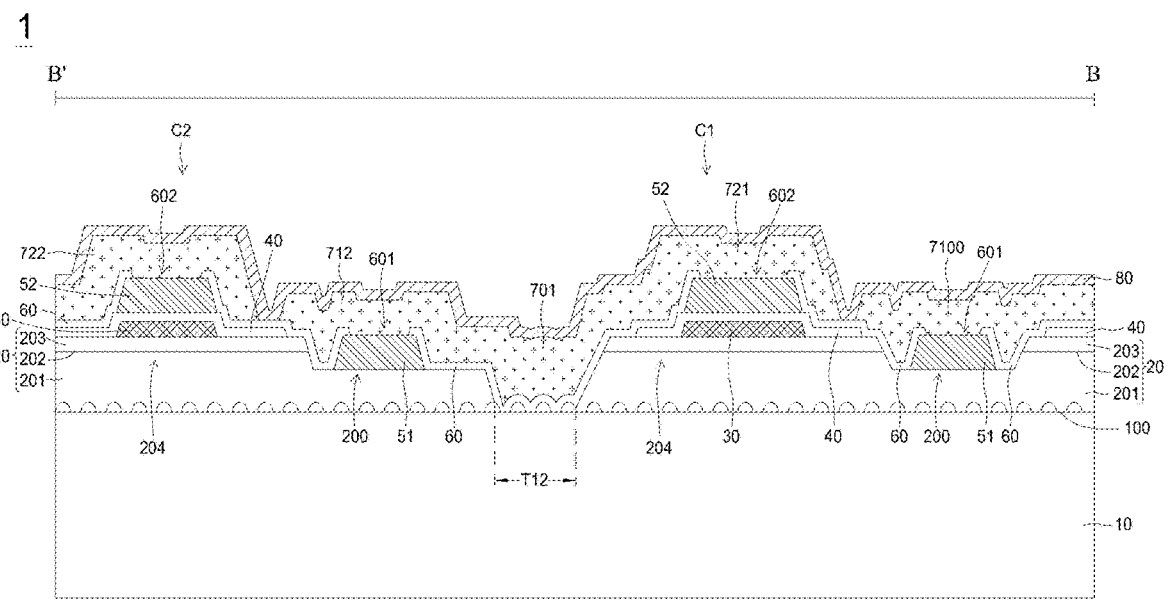
FIG. 3 illustrates a cross-sectional view taken along line B-B' of FIG. 1.
Figure 4:
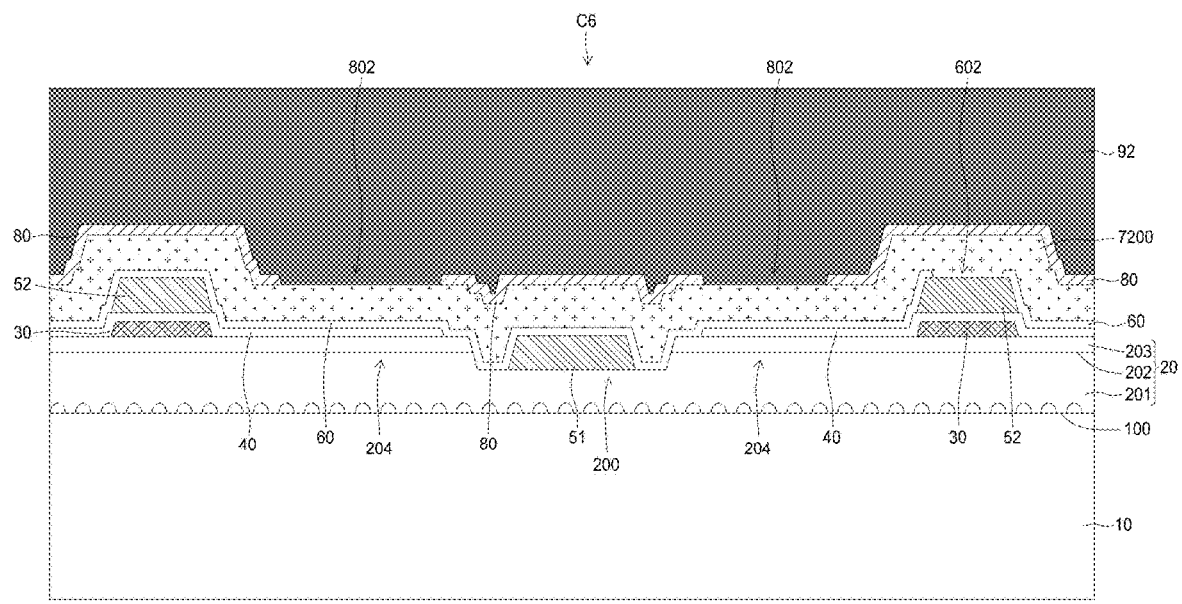
FIG. 4 illustrates a cross-sectional view taken along line C-C1-C2-C' of FIG. 1.
Figure 5:
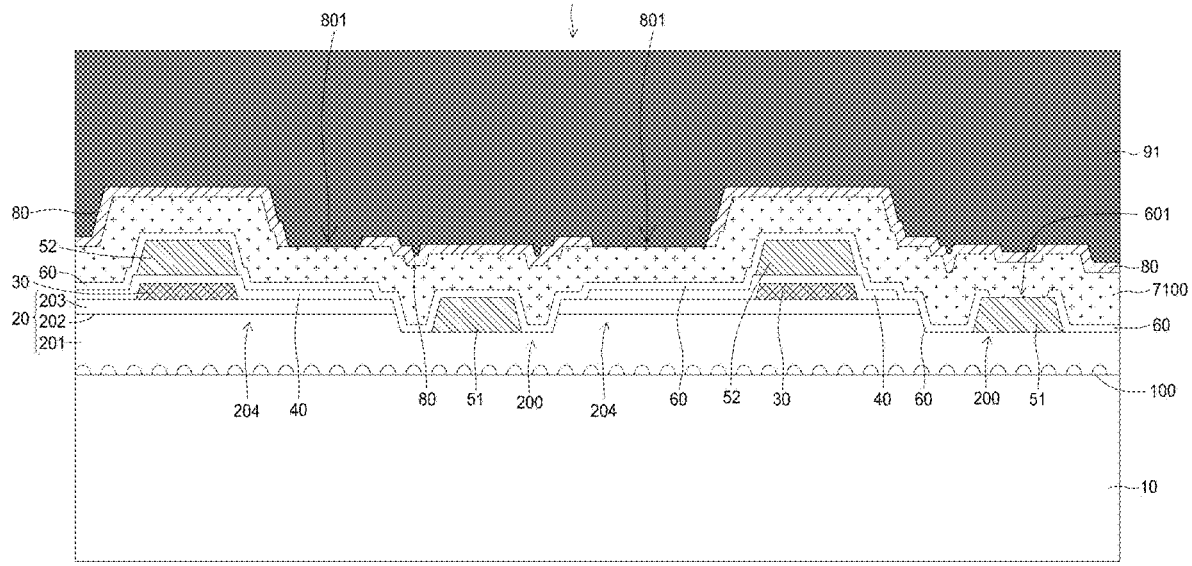
FIG. 5 illustrates a cross-sectional view taken along line D-D1-D2-D' of FIG. 1.

FIG. 1 illustrates a top view of a light-emitting device 1 in accordance with an embodiment of the present application. FIG. 2 illustrates a cross-sectional view taken along line A-A' of FIG. 1. FIG. 3 illustrates a cross-sectional view taken along line B-B' of FIG. 1. FIG. 4 illustrates a cross-sectional view taken along line C-C1-C2-C' of FIG. 1. FIG. 5 illustrates a cross-sectional view taken along line D-D1-D2-D' of FIG. 1.

As shown in FIG. 1, FIG. 2, FIG. 3, FIG. 4 and FIG. 5, the light-emitting device 1 comprises a substrate 10 comprising a top surface 100; a plurality of light-emitting units C1~C6 formed on the top surface 100 of the substrate 10 comprising a first light-emitting unit C1, a second light-emitting unit C6, and one or a plurality of third light-emitting units C2, C3, C4 and C5 wherein the plurality of light-emitting units C1~C6 each comprises a first semiconductor layer 201, an active layer 202 and a second semiconductor layer 203; an insulating layer 60 comprising a first insulating layer opening 601 and a second insulating layer opening 602 formed on each of light-emitting units C1~C6; a first extension electrode 7100 covering the first light-emitting unit C1 wherein the first extension electrode 7100 covers the first insulating layer opening 601 on the first light-emitting unit C1 without covering the second insulating layer opening 602 on the first light-emitting unit C1; a second extension electrode 7200 covering the second light-emitting unit C6 wherein the second extension electrode 7200 covers the second insulating layer opening 602 on the second light-emitting unit C6 without covering the first insulating layer opening 601 on the second light-emitting unit C6; a first electrode pad 91 covering a first part of the plurality of the light-emitting units C1~C6; and a second electrode pad 92 covering a second part of the plurality of light-emitting units C1~C6.

The substrate 10 comprises a top surface 100. The substrate 10 can be a growth substrate for the epitaxial growth of a semiconductor stack 20, comprising gallium arsenide (GaAs) wafer for growing aluminum gallium indium phosphide (AlGaInP), or sapphire (Al$_2$O$_3$) wafer, gallium nitride (GaN) wafer or silicon carbide (SiC) wafer for growing gallium nitride (GaN), indium gallium nitride (InGaN) or aluminum gallium nitride (AlGaN). In another embodiment, the substrate 10 can be a support substrate for supporting the semiconductor stack 20 which was originally epitaxially grown on the growth substrate and then being transferred to the support substrate. The growth substrate originally used for epitaxial growth is optionally removed according to the requirements of the application.

The support substrate comprises a conductive material such as silicon (Si), aluminum (Al), copper (Cu), tungsten (W), molybdenum (Mo), gold (Au), silver (Ag), silicon carbide (SiC) or an alloy of the above materials, or a thermally conductive material such as diamond, graphite or aluminum nitride. Although the feature is omitted in the figures, the side of the substrate 10 that is in contact with the semiconductor stack 20 comprises a rough surface, and the rough surface comprises a surface having an irregular morphology or a surface having a regular morphology, for example, the surface having a plurality of hemispheres, the surface having a plurality of cones, or the surface having a plurality of pyramids protruding or recessed from the top surface 100.

In an embodiment of the present application, the semiconductor stack 20 with optical characteristics, such as a light-emitting stack, is formed on the substrate 10 by organic metal chemical vapor deposition (MOCVD), molecular beam epitaxy (MBE), hydride vapor deposition (HVPE), physical vapor deposition (PVD), or ion plating, wherein physical vapor deposition (PVD) comprises sputtering or evaporation.

In an embodiment of the present application, the semiconductor stack 20 comprises the first semiconductor layer 201, the active layer 202 and the second semiconductor layer 203. The semiconductor stack 20 further comprises a buffer layer (not shown) formed between the first semiconductor layer 201 and the substrate 10 which can release the stress caused by lattice mismatch between the materials of the substrate 10 and the first semiconductor layer 201 so the lattice dislocation and the lattice defect are reduced and the epitaxial quality of the semiconductor stack is improved. The buffer layer comprises a single layer or a plurality of layers. In an embodiment, an aluminum nitride (AlN) layer formed by using PVD method can be the buffer layer formed between the semiconductor stack 20 and the substrate 10 to improve the epitaxial quality of the semiconductor stack 20. In an embodiment, the method for forming aluminum nitride (AlN) is PVD, and the target is made of aluminum nitride. In another embodiment, a target made of aluminum reacts with a nitrogen source to form the aluminum nitride.

The wavelength of the light emitted from the light-emitting device 1 is adjusted by changing the physical and chemical composition of one or more layers in the semiconductor stack 20. The material of the semiconductor stack 20 comprises a group III-V semiconductor material, such as $Al_xIn_yGa_{(1-x-y)}N$ or $Al_xIn_yGa_{(1-x-y)}P$, wherein $0 \leq x$, $y \leq 1$; $(x+y) \leq 1$. When the material of the semiconductor stack 20 comprises AlInGaP series material, the red light having a wavelength between 610 nm and 650 nm or the green light having a wavelength between 530 nm and 570 nm can be emitted. When the material of the semiconductor stack 20 comprises InGaN series material, the blue light having a wavelength between 400 nm and 490 nm can be emitted. When the material of the semiconductor stack 20 comprises AlGaN or AlInGaN series material, the UV light having a wavelength between 400 nm and 250 nm can be emitted.

The first semiconductor layer 201 and the second semiconductor layer 203 can be cladding layers or confinement layers having different conductivity types, electrical properties, polarities, or doping elements for providing electrons or holes. For example, the first semiconductor layer 201 is an n-type semiconductor and the second semiconductor layer 203 is a p-type semiconductor. The active layer 202 is formed between the first semiconductor layer 201 and the second semiconductor layer 203. The electrons and holes combine in the active layer 202 under a current driving to convert the electric energy into the light energy and then the light is emitted from the active layer 202. The active layer 202 can be a single heterostructure (SH), a double heterostructure (DH), a double-side double heterostructure (DDH), or a multi-quantum well structure (MQW). The material of the active layer 123 can be i-type, p-type, or n-type semiconductor. The first semiconductor layer 201, the active layer 202, or the second semiconductor layer 203 can be a single layer or a structure comprising a plurality of layers.

As shown in FIG. 2, FIG. 3, FIG. 4 and FIG. 5, the semiconductor stack 20 is selectively etched to form a recess 200 and a semiconductor mesa 204. Specifically, by removing a part of the second semiconductor layer 203 and the active layer 202, the semiconductor mesa 204 comprises the first semiconductor layer 201, the second semiconductor layer 203, and the active layer 202. The recess 200 exposes the first semiconductor layer 201 by removing a part of the second semiconductor layer 203 and the active layer 202.

The light-emitting device 1 comprises a trench T12, T23, T34, T45 and T56 respectively formed between two adjacent light-emitting units C1~C6, and the trenches T12, T23, T34, T45 and T56 expose the top surface 100 of the substrate 10. As shown in FIG. 1, the light-emitting device 1 comprises a first trench T12 formed between the first light-emitting unit C1 and the third light-emitting unit C2; a second trench T23 formed between two adjacent third light-emitting units C2 and C3; a third trench T34 formed between two adjacent third light-emitting units C3 and C4; a fourth trench T45 formed between two adjacent third light-emitting units C4 and C5; and a fifth trench T56 formed between the third light-emitting unit C5 and the second light-emitting unit C6, wherein each of the trenches T12, T23, T34, T45 and T56 exposes the top surface 100 of the substrate 10.

The light-emitting device 1 comprises one or a plurality of current blocking layers 30 formed on the second semiconductor layer 203. The current blocking layer 30 comprises a non-conductive material, comprising aluminum oxide ($Al_2O_3$), silicon nitride ($SiN_x$), silicon oxide ($SiO_x$), titanium oxide ($TiO_x$), or magnesium fluoride ($MgF_x$). The current blocking layer 30 comprises a distributed Bragg reflector (DBR), wherein the distributed Bragg reflector (DBR) comprises insulating materials with different refractive indexes stacked on each other. The current blocking layer 30 comprises a light transmittance of more than 80% or a light reflectance of more than 80% for the light emitted from the active layer 202.

The light-emitting device 1 comprises a conductive layer 40 formed on the second semiconductor layer 203 and/or the current blocking layer 30, and the conductive layer 40 covers a sidewall of the current blocking layer 30. The conductive layer 40 covering the current blocking layer 30 comprises a surface profile corresponding to that of the current blocking layer 30. The material of the conductive layer 40 comprises a material that is transparent to the light emitted from the active layer 202, such as a metal material with a thickness thinner than 100 Å or a transparent conductive oxide. The transparent conductive oxide comprises indium tin oxide (ITO) or indium zinc oxide (IZO).

The light-emitting device 1 comprises one or a plurality of first contact electrodes 51 respectively formed on the one or the plurality of recesses 200 of the plurality of light-emitting units C1~C6 to contact the first semiconductor layer 201, and one or a plurality of second contact electrodes 52 respectively formed on the second semiconductor layer 203 of the plurality of light-emitting units C1~C6. The first contact electrode 51 directly contacts the first semiconductor layer 201 of each of light-emitting units C1~C6, and the second contact electrode 52 directly contacts the conductive layer 40, the current blocking layer 30 or the second semiconductor layer 203 of each of light-emitting units C1~C6.

In an embodiment of the present application, in the top view of the light-emitting device 1 shown in FIG. 1, the position of the second contact electrode 52 is substantially the same as the position of the current blocking layer 30. The shape of the second contact electrode 52 and the shape of the current blocking layer 30 may be the same or different.

In an embodiment of the present application, in the top view of the light-emitting device 1 shown in FIG. 1, the first contact electrode 51 is formed between the plurality of second contact electrodes 52.

In an embodiment of the present application, in the top view of the light-emitting device 1 shown in FIG. 1, the plurality of second contact electrodes 52 comprises a second amount greater than a first amount of the plurality of first contact electrodes 51.

The light-emitting device 1 comprises an insulating layer 60 covering the semiconductor stack 20, wherein the insulating layer 60 comprises one or a plurality of first insulating layer openings 601 exposing the one or the plurality of first contact electrodes 51, and one or a plurality of second insulating layer openings 602 exposing the one or the plurality of second contact electrodes 52.

As shown in FIG. 1 and FIG. 3, the light-emitting device 1 comprises a first extension electrode 7100 covering the first light-emitting unit C1 and the plurality of third light-emitting units C2 and C3, wherein the first extension electrode 7100 covers the first insulating layer opening 601 of the first light-emitting unit C1 without covering the second insulating layer opening 602 of the first light-emitting unit C1, and the first insulating layer openings 601 and the second insulating layer openings 602 of the plurality of third light-emitting units C2 and C3. The first extension electrode 7100 contacts the first contact electrode 51 of the first light-emitting unit C1 through the first insulating layer opening 601 of the first light-emitting unit C1 and is electrically connected to the first semiconductor layer 201 of the first light-emitting unit C1.

As shown in FIG. 1 and FIG. 2, the light-emitting device 1 further comprises a second extension electrode 7200 covering the second light-emitting unit C6 and the plurality of third light-emitting units C4 and C5, wherein the second extension electrode 7200 covers the second insulating layer opening 602 of the second light-emitting unit C6 without covering the first insulating layer opening 601 of the second light-emitting unit C6 and the first insulating layer openings 601 and the second insulating layer openings 602 of the plurality of third light-emitting units C4 and C5. The second extension electrode 7200 contacts the second contact electrode 52 of the second light-emitting unit C6 through the second insulating layer opening 602 of the second light-emitting unit C6 and is electrically connected to the second semiconductor layer 203 of the second light-emitting unit C6.

The light-emitting device 1 comprises one or a plurality of connecting electrodes 71~75 formed between two adjacent light-emitting units C1~C6. As shown in FIG. 1, the connecting electrodes 71~75 comprises a first connecting electrode 71, a second connecting electrode 72, a third connecting electrode 73, a fourth connecting electrode 74, and a fifth connecting electrode 75. The first connecting electrode 71 is formed between the first light-emitting unit C1 and the third light-emitting unit C2, the second connecting electrode 72 is formed between two adjacent third light-emitting units C2 and C3, and the third connecting electrode 73 is formed between two adjacent third light-emitting units C3 and C4, the fourth connecting electrode 74 is formed between two adjacent third light-emitting units C4 and C5, and the fifth connecting electrode 75 is formed between the third light-emitting unit C5 and the second light-emitting unit C6.

The first connecting electrode 71, the second connecting electrode 72, the third connecting electrode 73, the fourth connecting electrode 74, and the fifth connecting electrode 75 each comprises a first electrical connecting portion 712, 713, 714, 715 and 716, a bridge connecting portion 701, 702, 703, 704 and 705, and a second electrical connecting portion 721, 722, 723, 724 and 725.

The first electrical connecting portions 712, 713, 714, 715 and 716 of the connecting electrodes 71~75 are used to contact the one or the plurality of first contact electrodes 51 and are electrically connected to the first semiconductor layer 201 of the plurality of light-emitting units C1~C6 through the first contact electrodes 51. The second electrical connecting portions 721, 722, 723, 724 and 725 of the connecting electrodes 71~75 are used to contact the one or the plurality of second contact electrodes 52 and are electrically connected to the second semiconductor layer 203 of the light-emitting units C1~C6 through the second contact electrodes 52.

The bridge connecting portions 701, 702, 702, 704 and 705 of the connecting electrodes 71~75 are respectively formed on the trenches T12, T23, T34, T45 and T56 and electrically connects two adjacent light-emitting units C1~C6.

In an embodiment of the present application, in the top view of the light-emitting device 1 shown in FIG. 1, the plurality of connecting electrodes 71~75 is formed on two sides of the first extension electrode 7100 and/or formed on two sides of the second extension electrode 7200.

The first contact electrodes 51, the second contact electrodes 52, the first extension electrode 7100, the second extension electrode 7200 and the connecting electrodes 71~75 comprise a metal material comprising chromium (Cr), titanium (Ti), tungsten (W), gold (Au), aluminum (Al), indium (In), tin (Sn), nickel (Ni), platinum (Pt) or an alloy of the above materials. The first contact electrodes 51, the second contact electrodes 52, the first extension electrode 7100, the second extension electrode 7200 and/or the connecting electrodes 71~75 comprise a single layer or multi-layers. For example, the first contact electrodes 51, the second contact electrodes 52, the first extension electrode 7100, the second extension electrode 7200 and/or the connecting electrodes 71~75 comprise Ti/Au stack, Ti/Pt/Au stack, Cr/Au stack, Cr/Pt/Au stack, Ni/Au stack, Cr/Ti/Al/Au stack, Ti/Al/Ti/Au stack, Cr/Al/Pt/Au stack, Ni/Pt/Au stack or Cr/Al/Cr/Ni/Au stack.

The light-emitting device 1 comprises a protective layer 80 covering the plurality of light-emitting units C1~C6, wherein the protective layer 80 comprises one or a plurality of first protective layer openings 801 to expose the first extension electrode 7100 and one or a plurality of second protective layer openings 802 to expose the second extension electrode 7200.

In an embodiment of the present application, in the top view of the light-emitting device 1 shown in FIG. 1, the plurality of first protective layer openings 801 is formed on the first extension electrode 7100 of the first light-emitting unit C1 and the plurality of third light-emitting units C2~C3, and the plurality of second protective layer openings 802 is formed on the second extension electrode 7200 of the second light-emitting unit C6 and the plurality of third light-emitting units C4~C5.

In an embodiment of the present application, when viewing from the top of the light-emitting device 1, one or the plurality of first protective layer openings 801 is only formed on the first extension electrode 7100 of the first light-emitting unit C1, and one or the plurality of second protective layer openings 802 is only formed on the second extension electrode 7200 of the second light-emitting unit C6.

In an embodiment of the present application, in the top view of the light-emitting device 1 shown in FIG. 1, the position of the first protective layer opening 801 does not overlap with that of the first insulating layer opening 601. The position of the second protective layer opening 802 does not overlap with that of the second insulating layer opening 602.

In an embodiment of the present application, in the top view of the light-emitting device 1 shown in FIG. 1, the first protective layer opening 801 and/or the second protective layer opening 802 comprises a non-linear pattern, such as a curve.

In an embodiment of the present application, in the top view of the light-emitting device 1, the first insulating layer opening 601 and/or the second insulating layer opening 602 comprises a circle, an ellipse, or a polygon.

The insulating layer 60 and the protective layer 80 comprise a non-conductive material comprising organic material, inorganic material or dielectric material. The organic material comprises Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, or fluorocarbon polymer. The inorganic material comprises silicone or glass. The dielectric material comprises aluminum oxide ($Al_2O_3$), silicon nitride ($SiN_x$), silicon oxide ($SiO_x$), titanium oxide ($TiO_x$), or magnesium fluoride ($MgF_x$).

The insulating layer 60 and/or the protective layer 80 comprises two or more materials of different refractive indices alternately stacked to form a Distributed Bragg Reflector (DBR), which selectively reflects light of a certain wavelength. For example, the Distributed Bragg Reflector (DBR) with high reflectivity can be formed by laminating $SiO_2/TiO_2$ or $SiO_2/Nb_2O_5$ layers.

When the wavelength of the light emitted from the light-emitting device 1 is $\lambda$, the optical thickness of the Distributed Bragg Reflector (DBR) can be an integral multiple of $\lambda/4$. The optical thickness of the Distributed Bragg Reflector (DBR) can have a deviation of ±30% on the basis of the integral multiple of $\lambda/4$.

As shown in FIG. 1, FIG. 4 and FIG. 5, the light-emitting device 1 comprises a first electrode pad 91 covering the first protective layer opening 801 to contact the first extension electrode 7100 and a second electrode pad 92 covering the second protective layer opening 802 to contact the second extension electrode 7200.

In an embodiment of the present application, in the top view of the light-emitting device 1 shown in FIG. 1, the first electrode pad 91 and the second electrode pad 92 do not cover the one or the plurality of connecting electrodes 71~75.

In an embodiment of the present application, in the top view of the light-emitting device 1 shown in FIG. 1, the first electrode pad 91 and the second electrode pad 92 do not cover the first insulating layer opening 601 and/or the second insulating layer opening 602.

In an embodiment of the present application, in the top view of the light-emitting device 1 shown in FIG. 1, the plurality of connecting electrodes 71~72 is formed on two sides of the first electrode pad 91 and/or the plurality of connecting electrodes 74~75 is formed on two sides of the second electrode pad 92.

In an embodiment of the present application, in the top view of the light-emitting device 1 shown in FIG. 1, the first electrode pad 91 is surrounded by the plurality of connecting electrodes 71~72, and/or the second electrode pad 92 is surrounded by the plurality of connecting electrodes 74~75.

In an embodiment of the present application, in the top view of the light-emitting device 1 shown in FIG. 1, the first electrode pad 91 comprises a first electrode pad area smaller than a first surface area of the first extension electrode 7100, or the second electrode pad 92 comprises a second electrode pad area smaller than a second surface area of the second extension electrode 7200.

In an embodiment of the present application, in the top view of the light-emitting device 1 shown in FIG. 1, the first electrode pad 91 covers a first amount of the plurality of light-emitting units C1~C6, the second electrode pad 92 covers a second amount of the plurality of light-emitting cells C1~C6, and the first amount and the second amount is the same or different.

The first electrode pad 91 and the second electrode pad 92 comprise a metal material comprising chromium (Cr), titanium (Ti), tungsten (W), gold (Au), aluminum (Al), indium (In), tin (Sn), nickel (Ni), platinum (Pt) or an alloy of the above materials. The first electrode pad 91 and the second electrode pad 92 comprise a single layer or multilayers. For example, the first electrode pad 91 or the second electrode pad 92 comprises Ti/Au stack, Ti/Pt/Au stack, Cr/Au stack, Cr/Pt/Au stack, Ni/Au stack, Ni/Pt/Au stack, Cr/Al/Ti/Al/Ni//Pt/Au stack or Cr/Al/Cr/Ni/Au stack. The first electrode pad 91 and the second electrode pad 92 can be used as an electrical path for an external power source to supply current to the first semiconductor layer 201 and the second semiconductor layer 203.

The first electrode pad 91 and the second electrode pad 92 each comprises a thickness between 1~100 μm, preferably between 1.2~60 μm, and more preferably between 1.5~6 μm.

Figure 6:
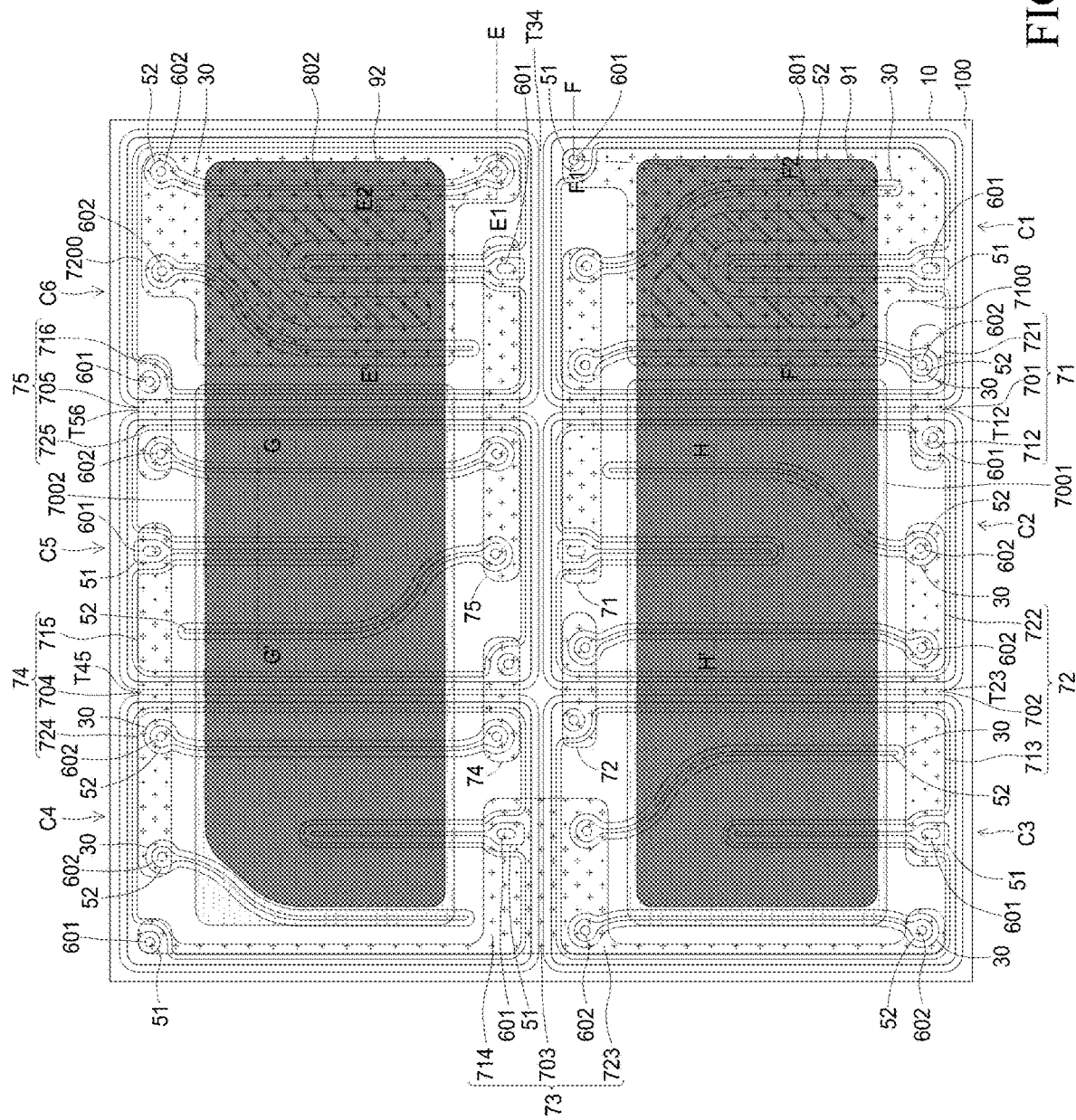
FIG. 6 illustrates a top view of a light-emitting device 2 in accordance with an embodiment of the present application.
Figure 7:
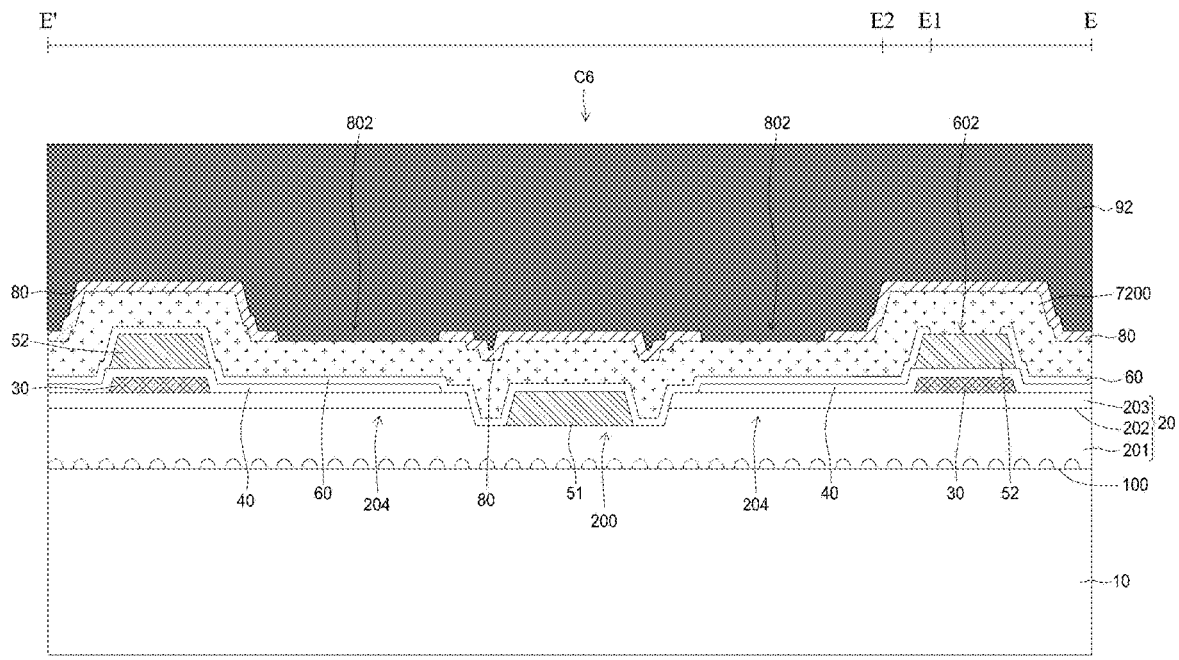
FIG. 7 illustrates a cross-sectional view taken along line E-E1-E2-E' of FIG. 6.
Figure 8:
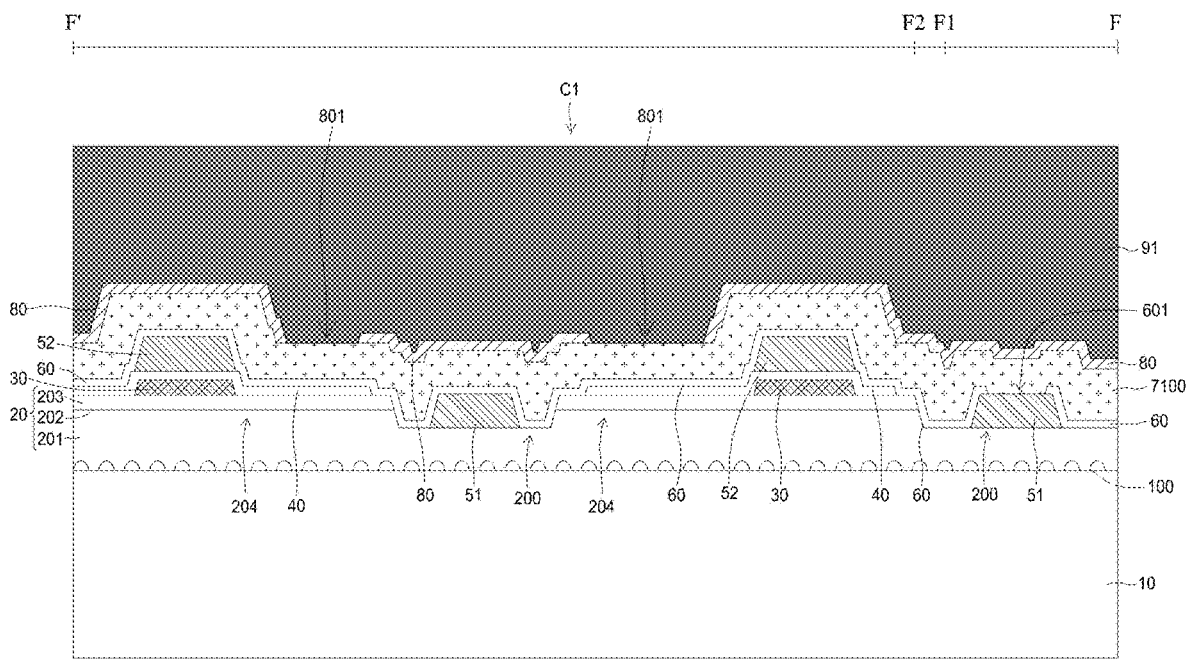
FIG. 8 illustrates a cross-sectional view taken along line F-F1-F2-F' of FIG. 6.
Figure 9:
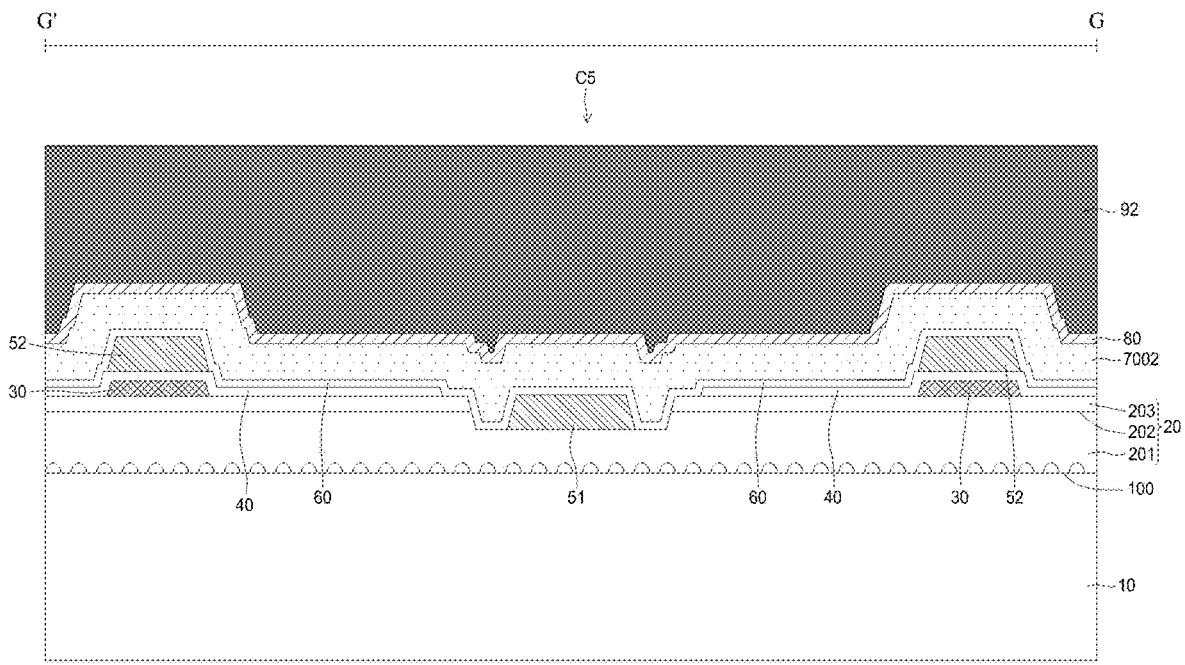
FIG. 9 illustrates a cross-sectional view taken along line G-G' of FIG. 6.
Figure 10:
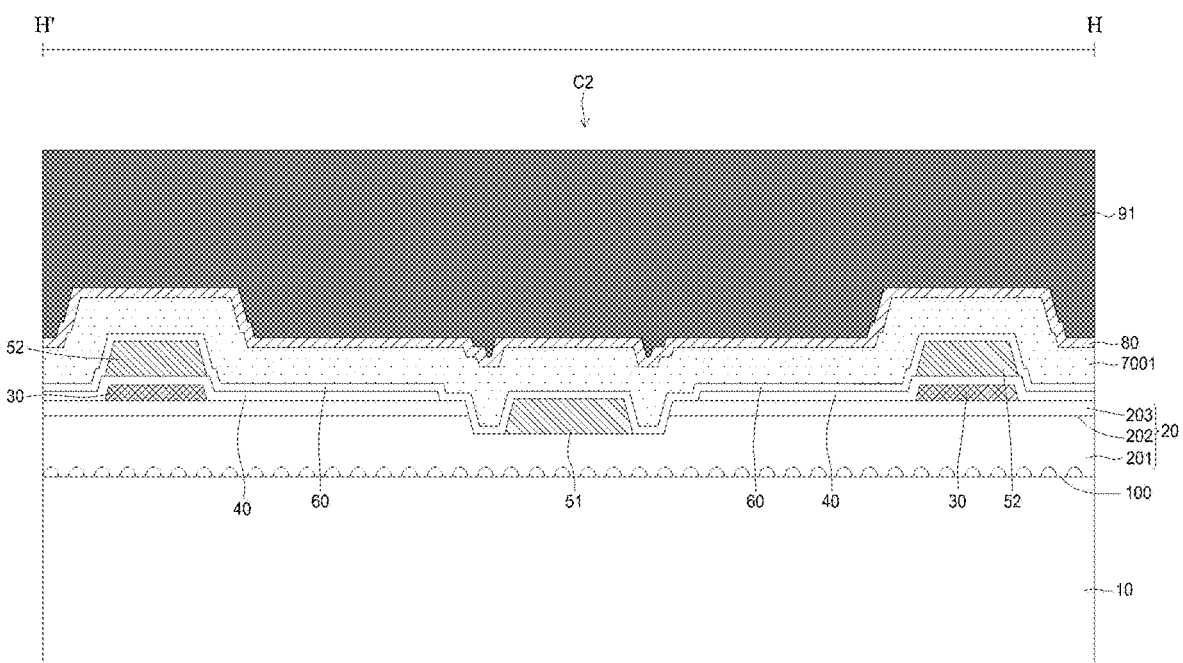
FIG. 10 illustrates a cross-sectional view taken along line H-H' of FIG. 6.

FIG. 6 is a top view of a light-emitting device 2 in accordance with an embodiment of the present application. FIG. 7 illustrates a cross-sectional view taken along line E-E1-E2-E' of FIG. 6. FIG. 8 illustrates a cross-sectional view taken along line F-F1-F2-F' of FIG. 6. FIG. 9 illustrates a cross-sectional view taken along line G-G' of FIG. 6. FIG. 10 illustrates a cross-sectional view taken along line H-H' of FIG. 6. The light-emitting device 2 and the light-emitting device 1 have substantially the same structure. Therefore, the same names and the same reference numbers of the light-emitting device 2 shown in FIG. 6~FIG. 10 and the light-emitting device 1 shown in FIG. 1~FIG. 5 have the same structures, which will be omitted or not repeated here.

As shown in FIG. 6~FIG. 10, the light-emitting device 2 comprises a substrate 10 comprising a top surface 100; a plurality of light-emitting units C1~C6 formed on the substrate 10 comprising a first light-emitting unit C1, a second light-emitting unit C6, and one or a plurality of third light-emitting units C2~C5 wherein each of light-emitting units C1~C6 comprises a first semiconductor layer 201, an active layer 202, and a second semiconductor layer 203; an insulating layer 60 comprising a first insulating layer opening 601 and a second insulating layer opening 602 formed on each of light-emitting units C1~C6; a first extension electrode 7100 covering the first light-emitting unit C1 wherein the first extension electrode 7100 covers the first insulating layer opening 601 on the first light-emitting unit C1 without covering the second insulating layer opening 602 on the first light-emitting unit C1; the second extension electrode 7200 covering the second light-emitting unit C6 wherein the second extension electrode 7200 covers the second insulating layer opening 602 on the second light-emitting unit C6 without covering the first insulating layer opening 601 on the second light-emitting unit C6; a first electrode pad 91 covering a first part of the plurality of the light-emitting units C1~C6; and a second electrode pad 92 covering a second part of the plurality of light-emitting units C1~C6.

The light-emitting device 2 comprises a trench T12, T23, T34, T45 or T56 formed between two adjacent light-emitting units C1~C6, and the trenches T12, T23, T34, T45 and T56 expose the top surface 100 of the substrate 10. One or a plurality of current blocking layers 30 is formed on the second semiconductor layer 203. The light-emitting device 2 comprises a conductive layer 40 formed on the second semiconductor layer 203 and/or the current blocking layer 30, and the conductive layer 40 covers a sidewall of the current blocking layer 30. The light-emitting device 2 comprises one or a plurality of first contact electrodes 51 respectively formed on one or a plurality of recesses 200 of the plurality of light-emitting units C1~C6 to contact the first semiconductor layer 201 and one or a plurality of second contact electrodes 52 respectively formed on the second semiconductor layers 203 of the plurality of light-emitting units C1~C6. The light-emitting device 2 comprises an insulating layer 60 to cover the semiconductor stack 20, wherein the insulating layer 60 comprises one or a plurality of first insulating layer openings 601 to expose the one or the plurality of first contact electrodes 51 and one or a plurality of second insulating layer openings 602 to expose the one or the plurality of second contact electrodes 52.

In an embodiment of the present application, in the top view of the light-emitting device 2 shown in FIG. 6, the light-emitting device 2 comprises a first extension electrode 7100 covering the first light-emitting unit C1, wherein the first extension electrode 7100 covers the first insulating layer opening 601 of the first light-emitting unit C1 without covering the second insulating layer opening 602 of the first light-emitting unit C1. The first extension electrode 7100 contacts the first contact electrode 51 of the first light-emitting unit C1 through the first insulating layer opening 601 of the first light-emitting unit C1 and is electrically connected to the first semiconductor layer 201 of the first light-emitting unit C1.

The light-emitting device 2 further comprises a second extension electrode 7200 covering the second light-emitting unit C6, wherein the second extension electrode 7200 covers the second insulating layer opening 602 of the second light-emitting unit C6 without covering the first insulating layer opens 601 of the second light-emitting unit C6. The second extension electrode 7200 contacts the second contact electrode 52 of the second light-emitting unit C6 through the second insulating layer opening 602 of the second light emitting unit C6 and is electrically connected to the second semiconductor layer 203 of the second light-emitting unit C6.

The light-emitting device 2 comprises one or a plurality of connecting electrodes 71~75 formed between two adjacent light-emitting units C1~C6. The connecting electrodes 71~75 comprise a first connecting electrode 71, a second connecting electrode 72, a third connecting electrode 73, a fourth connecting electrode 74, and a fifth connecting electrode 75. The first connecting electrode 71, the second connecting electrode 72, the third connecting electrode 73, the fourth connecting electrode 74, and the fifth connecting electrode 75 each comprises a first electrical connecting portion 712, 713, 714, 715 and 716, a bridge connecting portion 701, 702, 703, 704 and 705, and a second electrical connecting portion 721, 722, 723, 724 and 725.

In an embodiment of the present application, as shown in FIG. 6, FIG. 9 and FIG. 10, the light-emitting device 2 further comprises a first metal layer 7001 covering the first light-emitting unit C1 and the plurality of third light-emitting units C2~C3 and a second metal layer 7002 covering the second light-emitting unit C6 and the plurality of third light-emitting units C4~C5, wherein the first metal layer 7001 and the second metal layer 7002 are electrically insulated from the plurality of light-emitting units C1~C6.

In an embodiment of the present application, as shown in FIG. 6, FIG. 9 and FIG. 10, the first metal layer 7001 and the second metal layer 7002 cover a part of the first contact electrode 51 and the second contact electrode 52, but the positions of the first metal layer 7001 and the second metal layer 7002 are misaligned with the positions of the first insulating layer opening 601 and the second insulating layer opening 602. In other words, the first metal layer 7001 and the second metal layer 7002 do not overlap with the first insulating layer opening 601 and the second insulating layer opening 602.

In an embodiment of the present application, as shown in FIG. 6, the first metal layer 7001 covers the first trench T12 formed between the first light-emitting unit C1 and the third light-emitting unit C2, and/or the second trench T23 formed between the two adjacent third light-emitting units C2 and C3. The second metal layer 7002 covers the fourth trench T45 formed between the two adjacent third light-emitting units C4 and C5, and/or the fifth trench T56 formed between the third light-emitting unit C5 and the second light-emitting unit C6.

In an embodiment of the present application, in the top view of the light-emitting device 2 shown in FIG. 6, the first metal layer 7001 comprises a first metal surface area larger than a first extension surface area of the first extension electrode 7100, and/or the second metal layer 7002 comprises a second metal surface area larger than a second extension surface area of the second extension electrode 7200.

In an embodiment of the present application, in the top view of the light-emitting device 2, a plurality of connecting electrodes 71~72 are formed on two sides of the first extension electrode 7100 and the first metal layer 7001 and/or the plurality of connecting electrodes 74~75 are formed on two sides of the second extension electrode 7200 and the second metal layer 7002.

The light-emitting device 2 comprises a protective layer 80 covering the plurality of light-emitting units C1~C6, wherein the protective layer 80 comprises one or a plurality of first protective layer openings 801 to expose the first extension electrode 7100 and one or a plurality of second protective layer openings 802 to expose the second extension electrode 7200.

In an embodiment of the present application, in the top view of the light-emitting device 2 shown in FIG. 6, the one or the plurality of first protective layer openings 801 is only formed on the first extension electrode 7100 of the first light-emitting unit C1 and the one or the plurality of second protective layer openings 802 is only formed on the second extension electrode 7200 of the second light-emitting unit C6.

As shown in FIG. 6, FIG. 7 and FIG. 8, the light-emitting device 2 comprises a first electrode pad 91 covering the first protective layer opening 801 to contact the first extension electrode 7100 and a second electrode pad 92 covering the second protective layer opening 802 to contact the second extension electrode 7200.

In an embodiment of the present application, viewing from the top of the light-emitting device 2, the light-emitting device 2 comprises the plurality of first protective layer openings 801 respectively formed on the first extension electrode 7100 of the first light-emitting unit C1 and the first metal layer 7001 of the plurality of third light-emitting units C2~C3. The light-emitting device 2 comprises the plurality of second protective layer openings 802 respectively formed on the second extension electrode 7200 of the second light-emitting unit C6 and the second metal layer 7002 of the plurality of third light-emitting units C4~C5. The first electrode pad 91 covers the first protective layer openings 801 to contact the first extension electrode 7100 and the first metal layer 7001, and the second electrode pad 92 covers the second protective layer openings 802 to contact the second extension electrode 7200 and the second metal layer 7002.

In an embodiment of the present application, in the top view of the light-emitting device 2 shown in FIG. 6, the first electrode pad 91 and the second electrode pad 92 do not cover the one or the plurality of connecting electrodes 71~75.

In an embodiment of the present application, in the top view of the light-emitting device 2 shown in FIG. 6, the first electrode pad 91 and the second electrode pad 92 do not cover the first insulating layer opening 601 and/or the second insulating layer opening 602.

In an embodiment of the present application, in the top view of the light-emitting device 2 shown in FIG. 6, the first electrode pad 91 comprises a first electrode pad area larger than a first surface area of the first extension electrode 7100, or the second electrode pad 92 comprises a second electrode pad area larger than a second surface area of the second extension electrode 7200.

In an embodiment of the present application, in the top view of the light-emitting device 2 shown in FIG. 6, the first electrode pad 91 comprises a first electrode pad area larger than a first metal surface area of the first metal layer 7001, or the second electrode pad 92 comprises a second electrode pad area larger than a second metal surface area of the second metal layer 7002.

In an embodiment of the present application, in the top view of the light-emitting device 2 shown in FIG. 6, the first electrode pad 91 covers the first metal layer 7001 and the first extension electrode 7100, and the second electrode pad 92 covers the second metal layer 7002 and the second extension electrode 7200.

Figure 11:
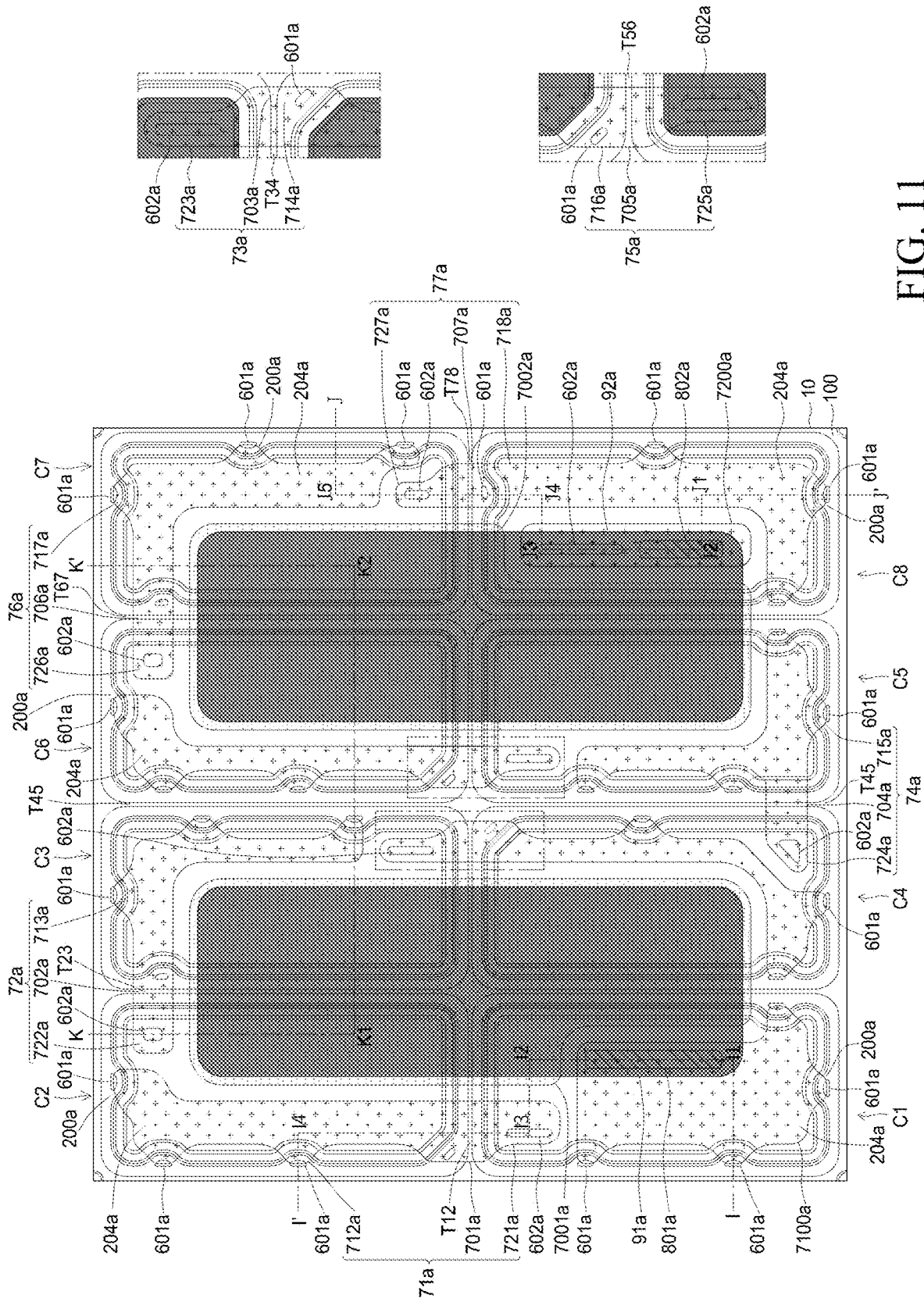
FIG. 11 illustrates a top view of a light-emitting device 3 in accordance with an embodiment of the present application.
Figure 12:
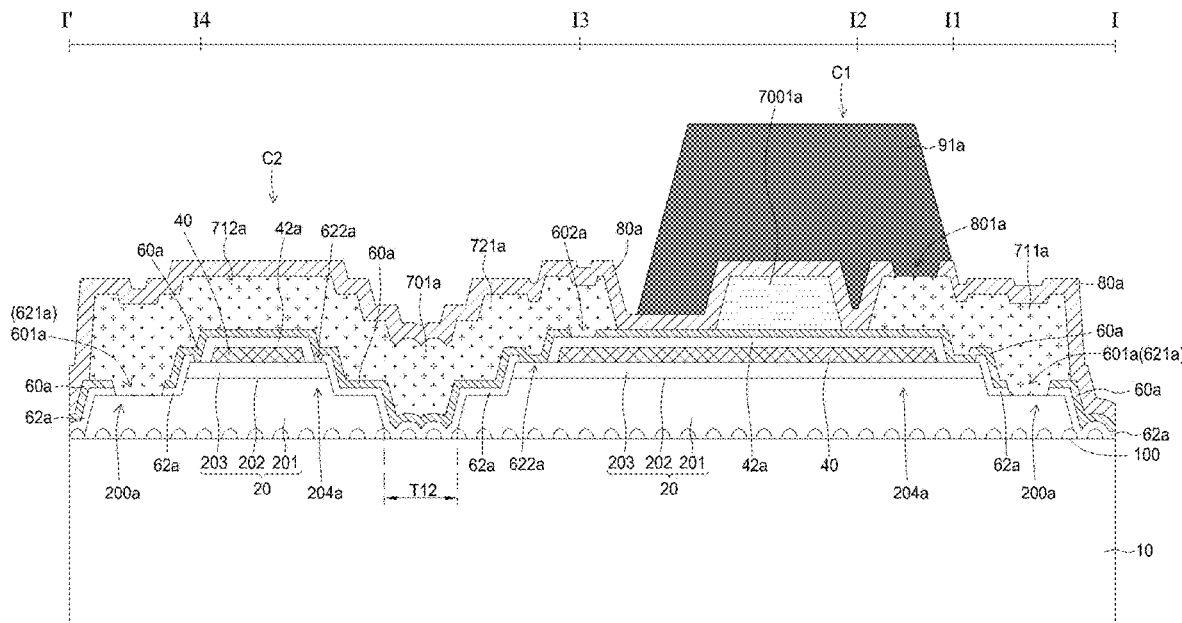
FIG. 12 illustrates a cross-sectional view taken along line I-I1-I2-I3-I4-I' of FIG. 11.
Figure 13:
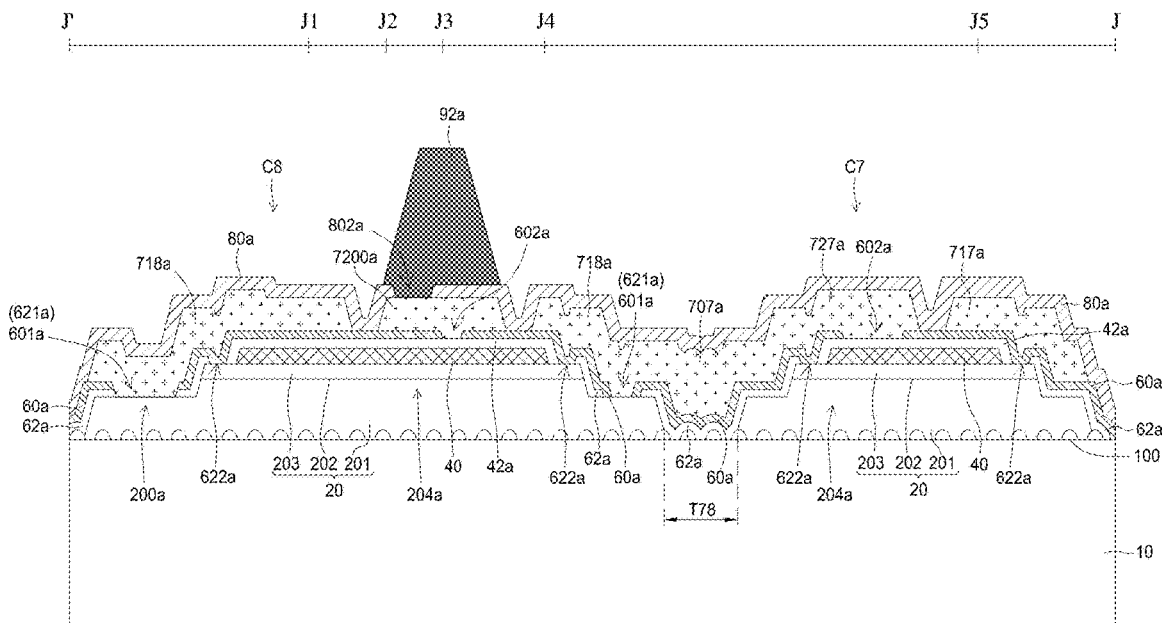
FIG. 13 illustrates a cross-sectional view taken along line J-J5-J4-J3-J2-J1-J' of FIG. 11.
Figure 14:
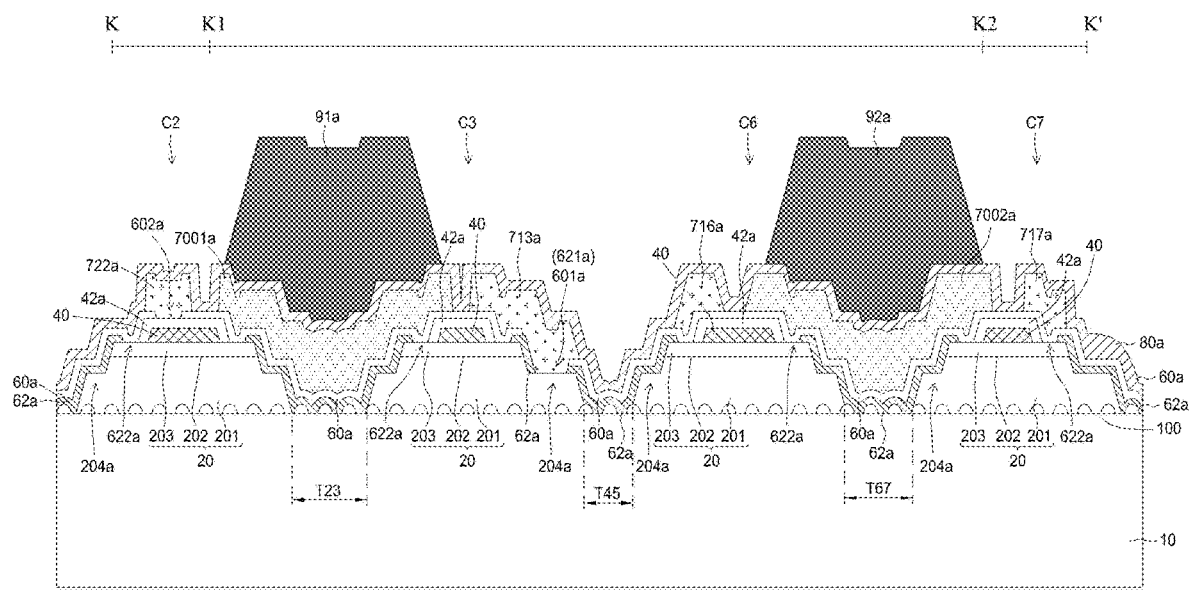
FIG. 14 illustrates a cross-sectional view taken along line K-K1-K2-K' of FIG. 11.

FIG. 11 illustrates a top view of a light-emitting device 3 in accordance with an embodiment of the present application. FIG. 12 illustrates a cross-sectional view taken along line I-I1-I2-I3-I4-I' of FIG. 11. FIG. 13 illustrates a cross-sectional view taken along line J-J5-J4-J3-J2-J1-J' of FIG. 11. FIG. 14 illustrates a cross-sectional view taken along line K-K1-K2-K' of FIG. 11. The light-emitting device 3 and the light-emitting device 1 have substantially the same structure. Therefore, the same names and the same reference numbers of the light-emitting device 3 shown in FIG. 11~FIG. 14 and the light-emitting device 1 shown in FIG. 1~FIG. 5 have the same structures, which will be omitted or not repeated here.

The light-emitting device 3 comprises a substrate 10 comprising a top surface 100; a plurality of light-emitting units C1~C8 formed on the top surface 100 of the substrate 10 comprising a first light-emitting unit C1, a second light-emitting unit C8, and one or a plurality of third light-emitting units C2~C7 wherein the light-emitting units C1~C8 each comprises a first semiconductor layer 201, an active layer 202, and a second semiconductor layer 203; a first metal layer 7001a covering the first light-emitting unit C1 and a first part of the plurality of third light-emitting units C2~C4; a second metal layer 7002a covering the second light-emitting unit C8 and a second part of the plurality of third light-emitting units C5~C7 wherein the first metal layer 7001a and the second metal layer 7002a are electrically insulated from the plurality of light-emitting units C1~C8; a first electrode pad 91a covering the first light-emitting unit C1 and the first part of the plurality of third light-emitting units C2~C4; and a second electrode pad 92a covering the second light-emitting unit C8 and the second part of the plurality of third light-emitting units C5~C7 wherein the first part of the plurality of third light-emitting units C2~C4 and the second part of the plurality of third light-emitting units C5~C7 comprise the same amount of the light-emitting units.

In an embodiment, the first light-emitting unit C1, the second light-emitting unit C8, and the one or the plurality of third light-emitting units C2~C7 is electrically connected in series.

As shown in FIG. 11~FIG. 14, the plurality of light-emitting units C1~C8 of the light-emitting device 3 each comprises one or a plurality of recesses 200a and a semiconductor mesa 204a, and the semiconductor mesa 204a is surrounded by the plurality of recesses 200a. Specifically, the semiconductor mesa 204a comprises the first semiconductor layer 201, the second semiconductor layer 203, and the active layer 202. The recess 200a exposes a surface of the first semiconductor layer 201.

The light-emitting device 3 comprises a trench T12, T23, T34, T45, T56, T67 and T78 formed between two adjacent light-emitting units C1~C8, and the trenches T12, T23, T34, T45, T56, T67 and T78 expose the top surface 100 of the substrate 10. As shown in FIG. 11, the light-emitting device 3 comprises a first trench T12 formed between the first light-emitting unit C1 and the third light-emitting unit C2; a second trench T23 formed between two adjacent third light-emitting units C2 and C3; a third trench T34 formed between two adjacent third light-emitting units C3 and C4; a fourth trench T45 formed between two adjacent third light-emitting units C4 and C5; a fifth trench T56 formed between two adjacent third light-emitting units C5 and C6; a sixth trench T67 formed between two adjacent third light-emitting units C6 and C7; and a seventh trench T78 formed between the third light-emitting unit C7 and the second light-emitting unit C8.

The light-emitting device 3 comprises a blocking layer 62a covering the semiconductor stack 20 of each of the light-emitting units C1~C8, wherein the blocking layer 62a comprises one or a plurality of first blocking layer openings 621a to expose the first semiconductor layer 201 of each of the light-emitting units C1~C8 and one or a plurality of second blocking layer openings 622a to expose the second semiconductor layer 203 of each of the light-emitting unit C1~C8.

As shown in FIG. 12~FIG. 14, the light-emitting device 3 comprises a conductive layer 40 formed in the one or the plurality of second blocking layer openings 622a of each of light-emitting units C1~C8 to contact the second semiconductor layer 203 and a metal reflective layer 42a formed in the one or the plurality of second blocking layer openings 622a to contact the second semiconductor layer 203 and/or the conductive layer 40. The metal reflective layer 42a is formed on the conductive layer 40 and covers a sidewall of the conductive layer 40.

The conductive layer 40 comprises a material that is transparent to the light emitted from the active layer 202, such as a metal material with a thickness thinner than 100 Å or a transparent conductive oxide. The transparent conductive oxide comprises indium tin oxide (ITO) or indium zinc oxide (IZO). The material of the metal reflective layer 42a comprises a metal comprising aluminum (Al), silver (Ag), rhodium (Rh), platinum (Pt), or an alloy of the above materials. The metal reflective layer 42a can reflect a light so the light exits in a direction toward the substrate 10, wherein the reflected light is from the active layer 202 of each of the light-emitting units C1~C8.

In an embodiment, a barrier layer (not shown) is formed on the metal reflective layer 42a of each of the light-emitting units C1~C8 to cover a top surface and a side surface of the metal reflective layer 42a to avoid the surface oxidation of the metal reflective layer 42a, thereby deteriorating the reflectivity of the metal reflective layer 42a. The material of the barrier layer comprises metal materials, such as titanium (Ti), tungsten (W), aluminum (Al), indium (In), tin (Sn), nickel (Ni), chromium (Cr), platinum (Pt), or an alloy of the above materials. The barrier layer comprises a structure having one or more layers, such as titanium (Ti)/aluminum (Al), and/or nickel titanium alloy (NiTi)/titanium tungsten alloy (TiW).

In an embodiment, the metal reflective layer 42a of each of the light-emitting units C1~C8 is directly formed on the second semiconductor layer 203, and the conductive layer 40 is formed on the metal reflective layer 42a (not shown) to reduce the light from the active layer 202 of each of the light-emitting units C1~C8 being absorbed by the conductive layer 40. In an embodiment, the blocking layer 62a covers a periphery of the metal reflective layer 42a and the conductive layer 40 to protect the metal reflective layer 42a and the conductive layer 40 from being affected by the subsequent processes.

The light-emitting device 3 comprises an insulating layer 60a covering the semiconductor stack 20 of each of the light-emitting units C1~C8, wherein the insulating layer 60a comprises one or a plurality of first insulating layer openings 601a to expose the first semiconductor layer 201 of each of the light-emitting units C1~C8 and one or a plurality of second insulating layer openings 602a to expose the second semiconductor layer 203, the conductive layer 40 or the metal reflective layer 42a of each of the light-emitting units C1~C8.

In an embodiment, the one or the plurality of first insulating layer openings 601a is formed on an outer periphery of the light-emitting units C1~C8. Specifically, the semiconductor mesa 204a of each of the light-emitting units C1~C8 is surrounded by the one or the plurality of recesses 200a, and the one or the plurality of first insulating layer openings 601a is formed on the one or the plurality of recesses 200a to expose the surface of the first semiconductor layer 201.

As shown in FIG. 11~FIG. 14, the light-emitting device 3 comprises a first extension electrode 7100a covering the first light-emitting unit C1, wherein the first extension electrode 7100a covers the one or the plurality of first insulating layer opening 601a of the first light-emitting unit C1, and the first extension electrode 7100a contacts the first semiconductor layer 201 of the first light-emitting unit C1 through the one or the plurality of first insulating layer openings 601a. The light-emitting device 3 further comprises a second extension electrode 7200a covering the second light-emitting unit C8, wherein the second extension electrode 7200a covers the one or the plurality of second insulating layer openings 602a of the second light-emitting unit C8, and the second extension electrode 7200a is electrically connected to the second semiconductor layer 203 of the second light-emitting unit C8 through the one or the plurality of second insulating layer openings 602a.

The light-emitting device 3 comprises one or a plurality of connecting electrodes 71a~77a formed between two adjacent light-emitting units C1~C8. As shown in FIG. 11, the connecting electrodes 71a~77a comprise a first connecting electrode 71a, a second connecting electrode 72a, a third connecting electrode 73a, a fourth connecting electrode 74a, a fifth connecting electrode 75a, a sixth connecting electrode 76a, and a seventh connecting electrode 77a. The first connecting electrode 71a is formed between the first light-emitting unit C1 and the third light-emitting unit C2, the second connecting electrode 72a is formed between two adjacent third light-emitting units C2 and C3, the third connecting electrode 73a is formed between two adjacent third light-emitting units C3 and C4, the fourth connecting electrode 74a is formed between two adjacent third light-emitting units C4 and C5, the fifth connecting electrode 75a is formed between two adjacent third light-emitting units C5 and C6, the sixth connecting electrode 76a is formed between two adjacent third light-emitting units C6 and C7, and the seventh connecting electrode 77a is formed between the third light-emitting unit C7 and the second light-emitting unit C8.

The first connecting electrode 71a, the second connecting electrode 72a, the third connecting electrode 73a, the fourth connecting electrode 74a, the fifth connecting electrode 75a, the sixth connecting electrode 76a, and the seventh connecting electrode 77a each comprises a first electrical connecting portion 712a, 713a, 714a, 715a, 716a, 717a and 718a, a bridge connecting portion 701a, 702a, 703a, 704a, 705a, 706a and 707a, and a second electrical connecting portion 721a, 722a, 723a, 724a, 725a, 726a and 727a.

The first electrical connecting portions 712a, 713a, 714a, 715a, 716a, 717a and 718a of the connecting electrodes 71a~77a each contacts the first semiconductor layer 201 of each of light-emitting units C2~C8. The second electrical connecting portions 721a, 722a, 723a, 724a, 725a, 726a and 727a of the connecting electrodes 71a~77a each contacts the metal reflective layer 42a and/or the barrier layer of each of light-emitting units C1~C7 (not shown) and/or the conductive layer 40, and are electrically connected to the second semiconductor layers 203 of the plurality of light-emitting units C1~C7 through the metal reflective layer 42a, the barrier layer (not shown) and/or the conductive layer 40.

The bridge connecting portions 701a, 702a, 703a, 704a, 705a, 706a and 707a of the connecting electrodes 71a~77a are respectively formed on the trenches T12, T23, T34, T45, T56, T67 and T78 to electrically connect two adjacent light-emitting units C1~C8.

The light-emitting device 3 comprises a protective layer 80a covering the plurality of light-emitting units C1~C8, wherein the protective layer 80a comprises one or a plurality of first protective layer openings 801a to expose the first extension electrode 7100a of the first light-emitting unit C1 and one or a plurality of second protective layer openings 802a to expose the second extension electrode 7200a of the second light-emitting unit C8.

In an embodiment of the present application, viewing from the top of the light-emitting device 3, the plurality of first protective layer openings 801a is formed on the first extension electrode 7100a of the first light-emitting unit C1 and the plurality of first metal layer 7001a of the plurality of third light-emitting unit C2~C4, and/or the plurality of second protective layer openings 802a is formed on the second extension electrode 7200a of the second light-emitting unit C8 and/or on the second metal layer 7002a of the plurality of third light-emitting units C5~C7.

In an embodiment of the present application, in the top view of the light-emitting device 3 shown in FIG. 11, the position of the first protective layer opening 801a is misaligned with the first insulating layer opening 601a. The position of the second protective layer opening 802a is misaligned with that of the second insulating layer opening 602a.

The light-emitting device 3 comprises a first electrode pad 91a covering the first protective layer opening 801a to contact the first extension electrode 7100a formed on the first light-emitting unit C1 and a second electrode pad 92a covering the second protective layer opening 802a to contact the second extension electrode 7200a formed on the second light-emitting unit C8.

In an embodiment of the present application, in the top view of the light-emitting device 3 shown in FIG. 11, the first electrode pad 91a and the second electrode pad 92a do not cover the one or the plurality of connecting electrodes 71a~77a.

In an embodiment of the present application, in the top view of the light-emitting device 3 shown in FIG. 11, the first electrode pad 91a and the second electrode pad 92a do not cover the first insulating layer opening 601a and/or the second insulating layer opening 602a.

In an embodiment of the present application, in the top view of the light-emitting device 3 shown in FIG. 11, the first electrode pad 91a covers the first metal layer 7001a, and/or the second electrode pad 92a covers the second metal layer 7002a. As shown in FIG. 12 and FIG. 14, the protective layer 80a is formed between the first electrode pad 91a and the first metal layer 7001a, and the protective layer 80a is located between the second electrode pad 92a and the second metal layer 7002a.

In an embodiment of the present application, in the top view of the light-emitting device 3 shown in FIG. 11, the plurality of connecting electrodes 71a~74a is formed on two sides of the first electrode pad 91a and/or the plurality of connecting electrodes 74a-77a is formed on two sides of the second electrode pad 92a.

In an embodiment of the present application, in the top view of the light-emitting device 3 shown in FIG. 11, the first electrode pad 91a is surrounded by the plurality of connecting electrodes 71a~74a, and/or the second electrode pad 92a is surrounded by the plurality of connecting electrodes 74a~77a.

In an embodiment of the present application, in the top view of the light-emitting device 3 shown in FIG. 11, the first electrode pad 91a comprises a first electrode pad area larger than a first metal surface area of the first metal layer 7001a, or the second electrode pad 92a comprises a second electrode pad area larger than a second metal surface area of the second metal layer 7002a.

In an embodiment of the present application, in the top view of the light-emitting device 3 shown in FIG. 11, the first electrode pad 91a covers a first amount of the plurality of light-emitting units C1~C8, the second electrode pad 92a covers a second amount of the plurality of light-emitting units C1~C8, and the first amount and the second amount are the same or different.

Figure 15:
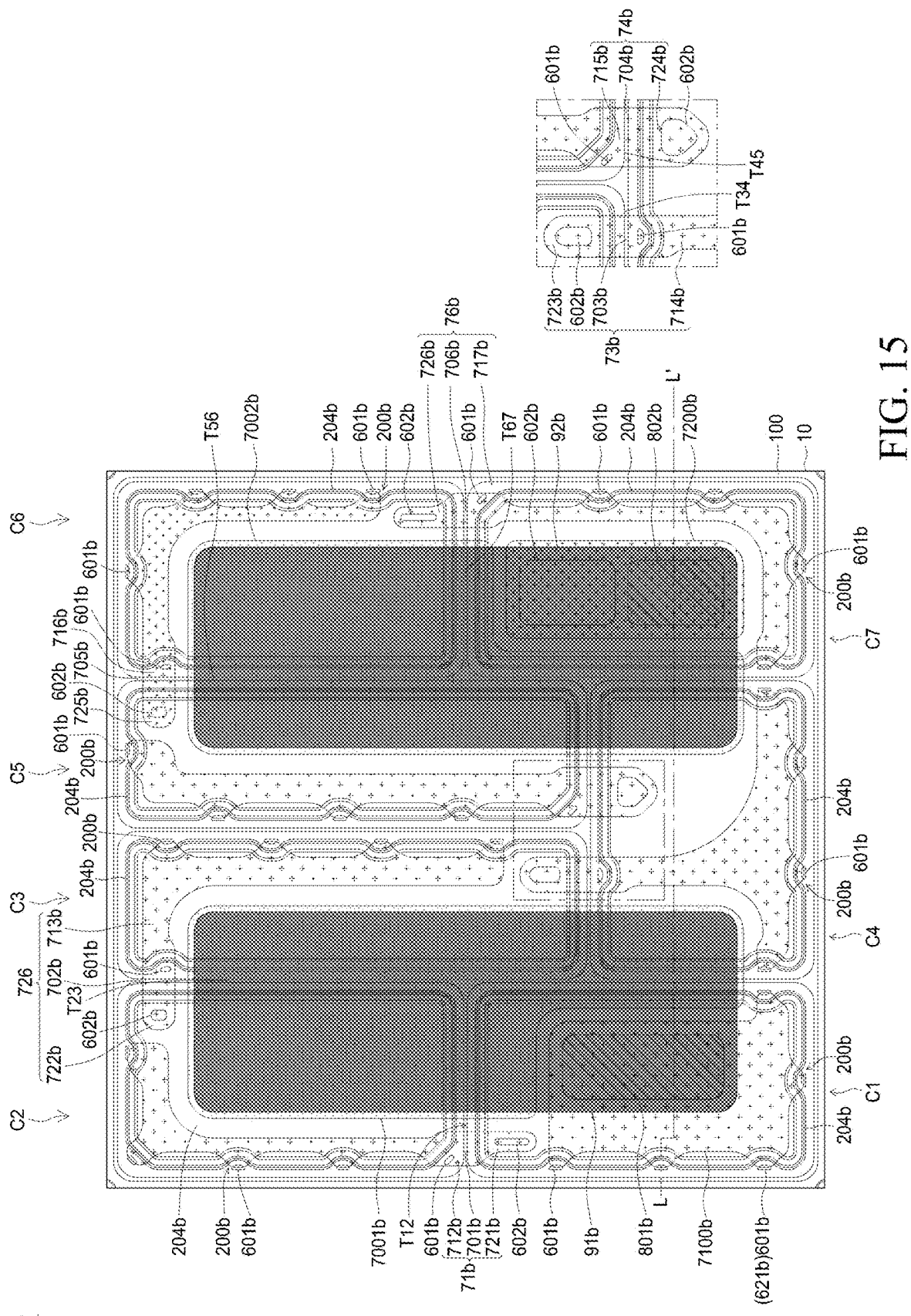
FIG. 15 illustrates a top view of a light-emitting device 4 in accordance with an embodiment of the present application.
Figure 16:
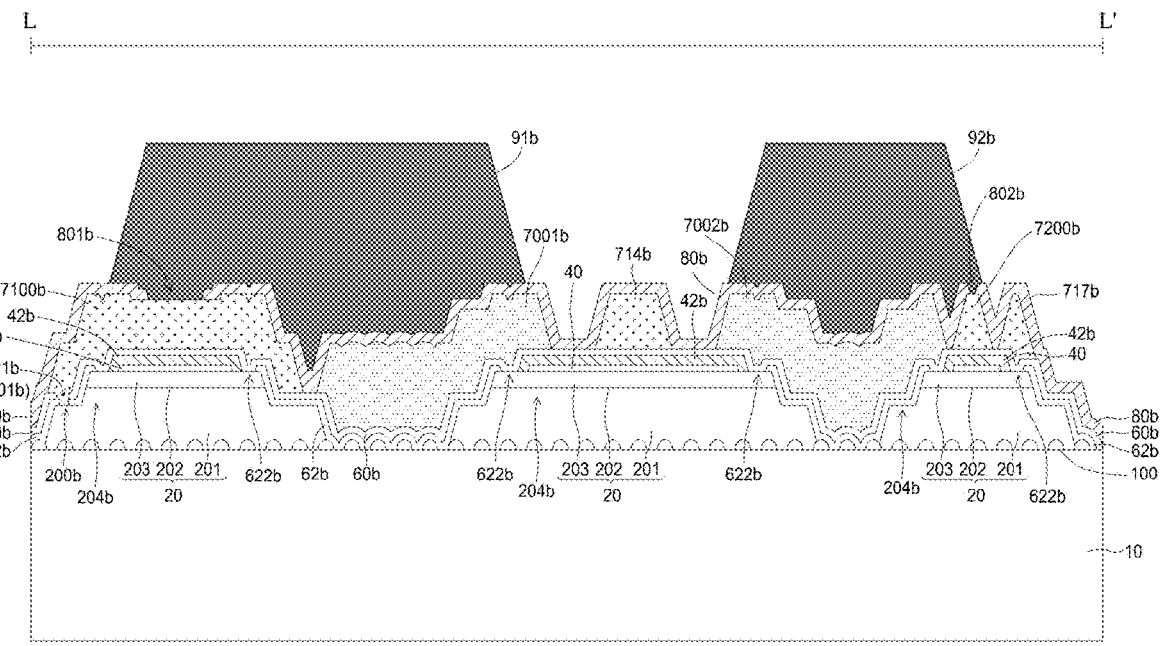
FIG. 16 illustrates a cross-sectional view taken along line L-L' of FIG. 15.

FIG. 15 illustrates a top view of a light-emitting device 4 in accordance with an embodiment of the present application. FIG. 16 illustrates a cross-sectional view taken along line L-L' of FIG. 15. The light-emitting device 4, the light-emitting device 1, and the light-emitting device 3 have substantially the same structure. Therefore, the same names and the same reference numbers of the light-emitting device 4 shown in FIG. 15~FIG. 16, the light-emitting device 1 shown in FIG. 1~FIG. 5 and the light-emitting device 3 shown in FIG. 11~FIG. 14 have the same structures, which will be omitted or not repeated here.

The light-emitting device 4 comprises a substrate 10 comprising a top surface 100; a plurality of light-emitting units C1~C7 formed on the top surface 100 of the substrate 10 comprising a first light-emitting unit C1, a second light-emitting unit C7, and one or a plurality of third light-emitting units C2~C6 wherein the plurality of light-emitting units C1~C7 each comprises a first semiconductor layer 201, an active layer 202 and a second semiconductor layer 203; a first metal layer 7001b covering the first light-emitting unit C1 and a first part of the plurality of third light-emitting units C2~C4; a second metal layer 7002b covering the second light-emitting unit C7 and a second part of the plurality of third light-emitting units C4~C6 wherein the first metal layer 7001b and the second metal layer 7002b are electrically insulated from the plurality of light-emitting units C1~C7; a first electrode pad 91b covering the first light-emitting unit C1 and the first part of the plurality of third light-emitting units C2~C4; and a second electrode pad 92b covering the second light-emitting unit C7 and the second part of the plurality of third light-emitting units C4~C6.

In an embodiment, the first light-emitting unit C1, the second light-emitting unit C7, and the one or the plurality of third light-emitting units C2~C6 is electrically connected in series.

In an embodiment of the present application, in the top view of the light-emitting device 4 shown in FIG. 15, the first light-emitting unit C1, the second light-emitting unit C7, and the plurality of third light-emitting units C2~C6 is arranged as a rectangle comprising a plurality of rows. The first light-emitting unit C1 and the third light-emitting unit C2 are arranged in a first row, the third light-emitting units C3~C5 are arranged in a second row, and the second light-emitting unit C7 and the third light-emitting unit C6 are arranged in a third row. The second row is located between the first row and the third row. The plurality of rows comprises different amount of light-emitting units from each other, for example, the amount of the light-emitting units located in the first row is different from the amount of the light-emitting units located in the second row.

As shown in FIG. 15~FIG. 16, the plurality of light-emitting units C1~C7 of the light-emitting device 4 each comprises one or a plurality of recesses 200b and a semiconductor mesa 204b. Specifically, the semiconductor mesa 204b comprises a first semiconductor layer 201, a second semiconductor layer 203, and an active layer 202. The recess 200b exposes a surface of the first semiconductor layer 201.

The light-emitting device 4 comprises a trench T12, T23, T34, T45, T56 and T67 formed between two adjacent light-emitting units C1~C7, and the trenches T12, T23, T34, T45, T56, T67 and T78 expose the top surface 100 of the substrate 10, wherein the trenches T34 and T45 are located on the same side of the third light-emitting unit C4, and the trenches T34 and T45 are directly connected. As shown in FIG. 15, the light-emitting device 4 comprises a first trench T12 formed between the first light-emitting unit C1 and the third light-emitting unit C2; a second trench T23 formed between two adjacent third light-emitting units C2 and C3; a third trench T34 formed between two adjacent third light-emitting units C3 and C4; a fourth trench T45 formed between two adjacent third light-emitting units C4 and C5, wherein the third light-emitting units C3 and C5 are located on the same side of the third light-emitting unit C4; a fifth trench T56 formed between the third light-emitting units C5 and C6; and a sixth trench T67 formed between the third light-emitting unit C6 and the second light-emitting unit C7.

The light-emitting device 4 comprises a blocking layer 62b covering the semiconductor stack 20 of each of the light-emitting units C1~C7, wherein the blocking layer 62b comprises one or a plurality of first blocking layer openings 621b exposing the first semiconductor layer 201 of each of the light-emitting units C1~C7, and one or plurality of second blocking layer openings 622b exposing the second semiconductor layer 203 of each of the light-emitting unit C1~C7.

As shown in FIGS. 15~16, the light-emitting device 4 comprises a conductive layer 40 formed in the one or the plurality of second blocking layer openings 622b of the plurality of light-emitting units C1~C7 to contact the second semiconductor layer 203; and a metal reflective layer 42b formed in the one or the plurality of second blocking layer openings 622b to contact the second semiconductor layer 203 and/or the conductive layer 40, wherein the metal reflective layer 42b is formed on the conductive layer 40 and covers the sidewall of the conductive layer 40.

The light-emitting device 4 comprises an insulating layer 60b to cover the semiconductor stack 20 of each of the light-emitting units C1~C7, wherein the insulating layer 60b comprises one or a plurality of first insulating layer openings 601b to expose the first semiconductor layer 201, and one or a plurality of second insulating layer openings 602b to expose the second semiconductor layer 203, the conductive layer 40 or the metal reflective layer 42b of each of the light-emitting units C1~C7.

In an embodiment, the one or the plurality of first insulating layer openings 601b is formed on an outer periphery of the light-emitting units C1~C7. Specifically, the semiconductor mesa 204b of each of the light-emitting units C1~C7 is surrounded by the one or the plurality of recesses 200b, and the one or the plurality of first insulating layer openings 601b is formed on the one or the plurality of recesses 200b to expose the surface of the first semiconductor layer 201.

As shown in FIGS. 15~16, the light-emitting device 4 comprises a first extension electrode 7100b covering the one or the plurality of first insulating layer openings 601b of the first light-emitting unit C1, and the first extension electrode 7100b contacts the first semiconductor layer 201 of the first light-emitting unit C1 through the one or the plurality of first insulating layer openings 601b. The light-emitting device 4 further comprises a second extension electrode 7200b covering the one or the plurality of second insulating layer openings 602b of the second light-emitting unit C7, and the second extension electrode 7200b is electrically connected to the second semiconductor layer 203 of the second light-emitting unit C7 through the one or the plurality of second insulating layer openings 602b.

The light-emitting device 4 comprises one or a plurality of connecting electrodes 71b~76b formed between two adjacent light-emitting units C1~C7. As shown in FIG. 15, the connecting electrodes 71b~76b comprise a first connecting electrode 71b, a second connecting electrode 72b, a third connecting electrode 73b, a fourth connecting electrode 74b, a fifth connecting electrode 75b, and a sixth connecting electrode 76b. The first connecting electrode 71b is formed between the first light-emitting unit C1 and the third light-emitting unit C2, the second connecting electrode 72b is formed between two adjacent third light-emitting units C2~C3, the third connecting electrode 73b is formed between two adjacent third light-emitting units C3~C4, the fourth connecting electrode 74b is formed between two adjacent third light-emitting units C4~C5, and the fifth connecting electrode 75b is formed between two adjacent third light-emitting units C5~C6, and the sixth connecting electrode 76b is formed between the third light-emitting unit C6 and the second light-emitting unit C7.

The first connecting electrode 71b, the second connecting electrode 72b, the third connecting electrode 73b, the fourth connecting electrode 74b, the fifth connecting electrode 75b, and the sixth connecting electrode 76b each comprises a first electrical connecting portion 712b, 713b, 714b, 715b, 716b and 717b, a bridge connecting portion 701b, 702b, 703b, 704b, 705b and 706b, and a second electrical connecting portion 721b, 722b, 723b, 724b, 725b and 726b.

The first electrical connecting portions 712b, 713b, 714b, 715b, 716b and 717b of the connecting electrodes 71b~76b each contacts the first semiconductor layer 201 of each of light-emitting units C2~C7. The second electrical connecting portions 721b, 722b, 723b, 724b, 725b and 726b of the connecting electrodes 71b~77b each contacts the metal reflective layer 42b and/or the barrier layer of each of light-emitting units C1~C6 (not shown), and are electrically connected to the second semiconductor layer 203 of each of light-emitting units C1~C7 through the metal reflective layer 42b and/or the barrier layer (not shown).

The bridge connecting portions 701b, 702b, 703b, 704b, 705b and 706b of the connecting electrodes 71b~76b are respectively formed on the trenches T12, T23, T34, T45, T56 and T67 and electrically connects two adjacent light-emitting units C1~C7.

The first metal layers 7001, 7001a, 7001b, the first extension electrodes 7100a, 7100b, the second metal layers 7002, 7002a, 7002b, the second extension electrodes 7200a, 7200b, and the connecting electrodes 71a~77a, 71b~76b comprise a metal material, such as chromium (Cr), titanium (Ti), tungsten (W), gold (Au), aluminum (Al), indium (In), tin (Sn), nickel (Ni), platinum (Pt) or an alloy of the above materials. The first metal layers 7001, 7001a, 7001b, the first extension electrodes 7100a, 7100b, the second metal layers 7002, 7002a, 7002b, the second extension electrodes 7200a, 7200b and the connecting electrodes 71a~77a, 71b~76b can compose of a single layer or multiple layers. For example, the first metal layers 7001, 7001a, 7001b, the first extension electrodes 7100a, 7100b, the second metal layers 7002, 7002a, 7002b, the second extension electrodes 7200a, 7200b and/or the connecting electrodes 71a~77a, 71b~76b comprise Ti/Au stack, Ti/Pt/Au stack, Cr/Au stack, Cr/Pt/Au stack, Ni/Au stack, Ni/Pt/Au stack or Cr/Al/Cr/Ni/Au stack.

The light-emitting device 4 comprises a protective layer 80b covering the plurality of light-emitting units C1~C7, wherein the protective layer 80b comprises one or a plurality of first protective layer openings 801b to expose the first extension electrode 7100b on the first light-emitting unit C1, and one or a plurality of second protective layer openings 802b to expose the second extension electrode 7200b on the second light-emitting unit C2.

In an embodiment of the present application, viewing from the top of the light-emitting device 4, the plurality of first protective layer openings 801b is formed on the first extension electrode 7100a of the first light-emitting unit C1 and the first metal layer 7001b of the plurality of third light-emitting unit C2~C4, and/or the plurality of second protective layer openings 802b is located on the second extension electrode 7200b of the second light-emitting unit C7 and the second metal layer 7002b of the plurality of light-emitting units C4~C6.

In an embodiment of the present application, in the top view of the light-emitting device 4 shown in FIG. 15, the position of the first protective layer opening 801b is misaligned with the first insulating layer opening 601b. The position of the second protective layer opening 802b is misaligned with the second insulating layer opening 602b.

The blocking layers 62a, 62b, the insulating layers 60a, 60b, and the protective layers 80a, 80b comprise non-conductive materials comprising the organic materials, the inorganic materials, or the dielectric materials. The organic materials comprise Su8, benzocyclobutene (BCB), perfluorocyclobutane (PFCB), epoxy resin (Epoxy), acrylic resin (Acrylic Resin), cycloolefin polymer (COC), polymethylmethacrylate (PMMA), polyethylene terephthalate (PET), polycarbonate (PC), polyetherimide or fluorocarbon polymer. The inorganic materials comprise silicone or glass. The dielectric materials comprise aluminum oxide ($Al_2O_3$), silicon nitride ($SiN_x$), silicon oxide ($SiO_x$), titanium oxide ($TiO_x$), or magnesium fluoride ($MgF_x$).

The blocking layers 62a, 62b, the insulating layers 60a, 60b, and/or the protective layers 80a, 80b comprise two or more materials with different refractive indexes alternately stacked to form a distributed Bragg reflector (DBR) structure to selectively reflect the light of a certain wavelength. For example, the distributed Bragg reflector (DBR) with high reflectivity can be formed by laminating $SiO_2/TiO_2$ or $SiO_2/Nb_2O_5$ layers.

The light-emitting device 4 comprises a first electrode pad 91b covering the first protective layer opening 801b to contact the first extension electrode 7100b on the first light-emitting unit C1 and a second electrode pad 92b covering the second protective layer opening 802b to contact the second extension electrode 7200b on the second light-emitting unit C7.

In an embodiment of the present application, in the top view of the light-emitting device 4, as shown in FIG. 15, the first electrode pad 91b and the second electrode pad 92b do not cover the one or the plurality of connecting electrodes 71b~76b.

In an embodiment of the present application, in the top view of the light-emitting device 4 shown in FIG. 15, the first electrode pad 91b and the second electrode pad 92b do not cover the first insulating layer opening 601b and/or the second insulating layer opening 602b.

In an embodiment of the present application, in the top view of the light-emitting device 4 shown in FIG. 15, the first electrode pad 91b covers the first metal layer 7001b, and/or the second electrode pad 92b covers the second metal layer 7002b. As shown in FIGS. 15~16, the protective layer 80b is formed between the first electrode pad 91b and the first metal layer 7001b, and the protective layer 80b is formed between the second electrode pad 92b and the second metal layer 7002b.

In an embodiment of the present application, in the top view of the light-emitting device 4 shown in FIG. 15, the first metal layer 7001b and the second metal layer 7002b cover the same third light-emitting unit C4.

In an embodiment of the present application, in the top view of the light-emitting device 4 shown in FIG. 15, the plurality of connecting electrodes 71b~73b is located on two sides of the first electrode pad 91b and/or the plurality of connecting electrodes 74b~76b is located on two sides of the second electrode pad 92b.

In an embodiment of the present application, in the top view of the light-emitting device 4 shown in FIG. 15, the first electrode pad 91b is surrounded by the plurality of connecting electrodes 71b~73b, and/or the second electrode pad 92b is surrounded by the plurality of connecting electrodes 74b~76b.

In an embodiment of the present application, in the top view of the light-emitting device 4 shown in FIG. 15, the first electrode pad 91b comprises a first electrode pad area larger than a first metal surface area of the first metal layer 7001b, or the second electrode pad 92b comprises a second electrode pad area larger than a second metal surface area of the second metal layer 7002b.

In an embodiment of the present application, in the top view of the light-emitting device 4 shown in FIG. 15, the light-emitting device 4 comprises an odd amount of light-emitting units C1~C7. The first electrode pad 91b covers a first amount of the plurality of light-emitting units C1~C7 and the second electrode pad 92b covers a second amount of the plurality of light-emitting units C1~C7, wherein the first electrode pad 91b and the second electrode pad 92b cover the same light-emitting unit, such as the third light-emitting unit C4.

The first electrode pads 91a, 91b and the second electrode pads 92a, 92b comprise metal materials, such as chromium (Cr), titanium (Ti), tungsten (W), gold (Au), aluminum (Al), indium (In), tin (Sn), nickel (Ni), platinum (Pt) or an alloy of the above materials. The first electrode pads 91a, 91b and the second electrode pads 92a, 92b comprise a single layer or multiple layers. For example, the first electrode pad 91a, 91b or the second electrode pad 92a, 92b comprises Ti/Au stack, Ti/Pt/Au stack, Cr/Au stack, Cr/Pt/Au stack, Ni/Au stack, Ni/Pt/Au stack or Cr/Al/Cr/Ni/Au stack. The first electrode pads 91a, 91b and the second electrode pads 92a, 92b are provided as a current path for external power supply connecting to the first semiconductor layer 201 and the second semiconductor layer 203.

The first electrode pads 91a, 91b and the second electrode pads 92a, 92b comprise a thickness between 1 and 100 μm, preferably between 1.2 and 60 μm, more preferably between 1.5 and 6 μm.

Figure 17:
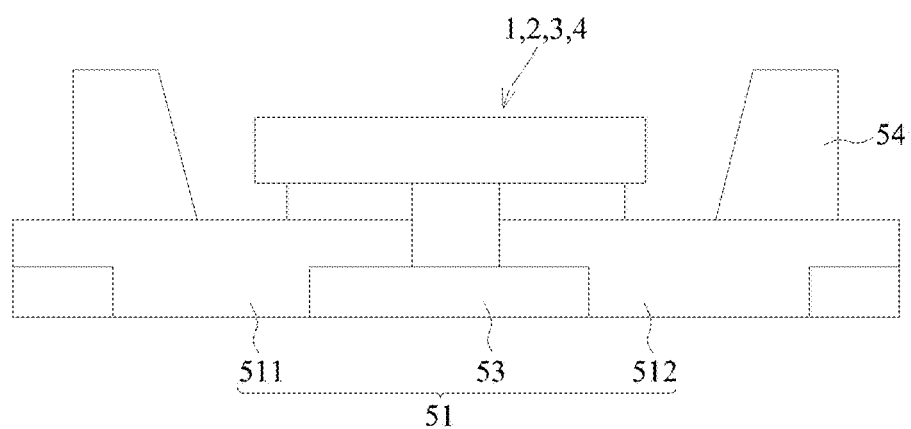
FIG. 17 illustrates a schematic view of a light-emitting apparatus 5 in accordance with an embodiment of the present application.

FIG. 17 is a schematic view of a light-emitting apparatus 5 in accordance with an embodiment of the present application. The light-emitting device 1, 2, 3 or 4 in the foregoing embodiment is mounted on the first spacer 511 and the second spacer 512 of the package substrate 51 in the form of flip chip. The first spacer 511 and the second spacer 512 are electrically insulated from each other by an insulating portion 53 comprising an insulating material. The main light-extraction surface of the flip chip is one side of the growth substrate opposite to the electrode-forming surface where the electrodes are formed on. A reflective structure 54 can be provided around the light-emitting device 1, 2, 3 or 4 to increase the light extraction efficiency of the light-emitting apparatus 5.

Figure 18:
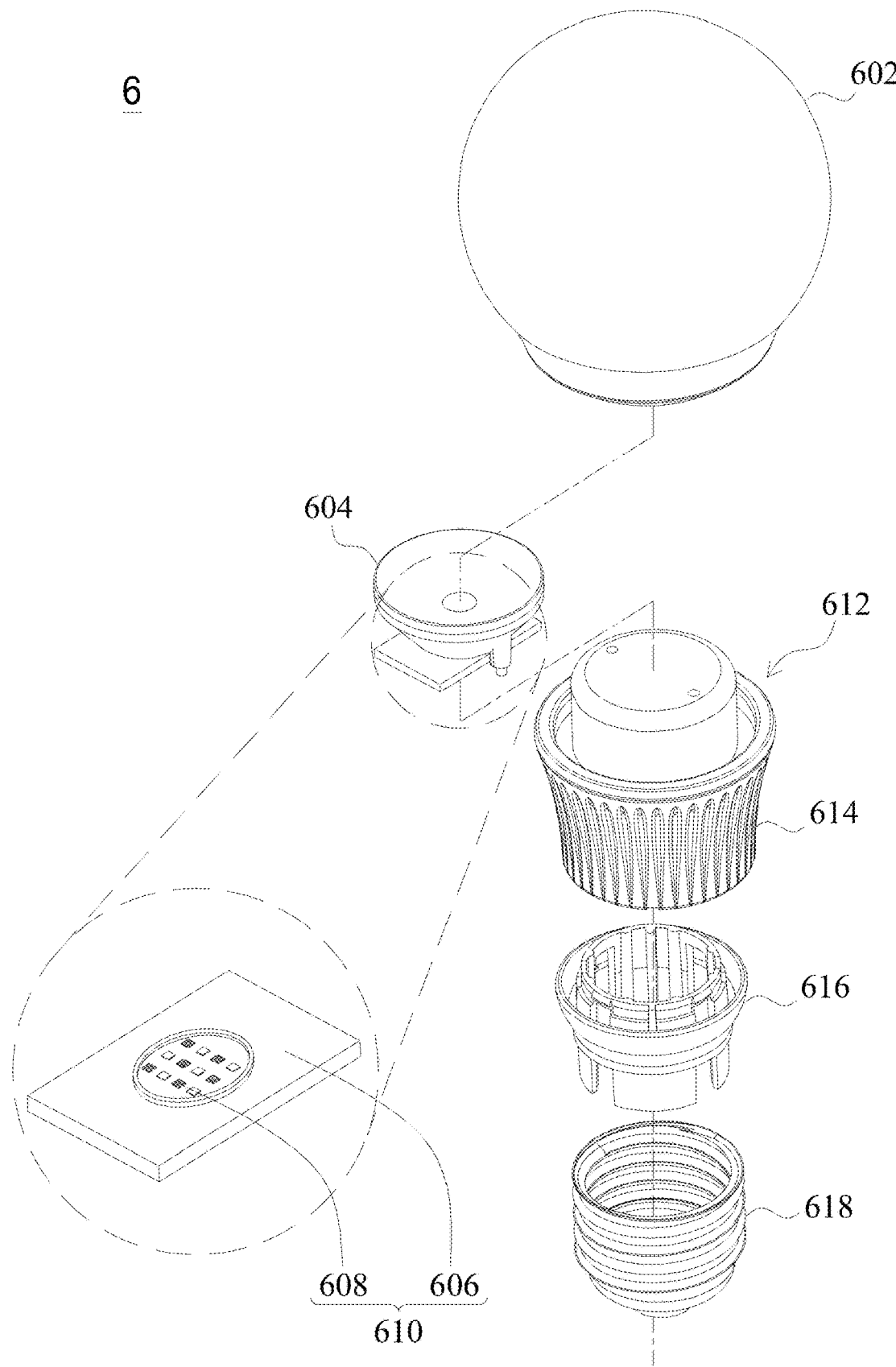
FIG. 18 illustrates a schematic view of a light-emitting apparatus 6 in accordance with an embodiment of the present application.

FIG. 18 illustrates a structure diagram of a light-emitting apparatus 6 in accordance with an embodiment of the present application. A light bulb comprises an envelope 602, a lens 604, a light-emitting module 610, a base 612, a heat sink 614, a connector 616 and an electrical connecting device 618. The light-emitting module 610 comprises a submount 606 and a plurality of light-emitting devices 608 on the submount 606, wherein the plurality of light-emitting devices 608 can be the light-emitting device 1, 2, 3 or 4 or the light-emitting apparatus 5 described in above embodiments.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
   a substrate comprising a top surface;
   a plurality of light-emitting units formed on the substrate and comprising a first light-emitting unit and a second light-emitting unit, wherein the plurality of light-emitting units each comprises a first semiconductor layer, an active layer, and a second semiconductor layer;
   an insulating layer comprising a plurality of opening structure respectively formed on the plurality of light-emitting units, wherein each of the plurality of opening structures comprises a first insulating layer opening and a second insulating layer opening;
   a first extension electrode covering the first light-emitting unit, wherein the first extension electrode covers the first insulating layer opening on the first light-emitting unit without covering the second insulating layer opening on the first light-emitting unit;
   a second extension electrode covering the second light-emitting unit, wherein the second extension electrode covers the second insulating layer opening on the second light-emitting unit without covering the first insulating layer opening on the second light-emitting unit; and
   a plurality of connecting electrodes formed between two adjacent of the plurality of light-emitting units, wherein the plurality of connecting electrodes is formed on two sides of the first extension electrode without overlapping the first extension electrode or two sides of the second extension electrode without overlapping the second extension electrode.

2. The light-emitting device according to claim 1, further comprising a plurality of electrode structures respectively formed on the plurality of light-emitting units, wherein each of the plurality of electrode structures comprises a first contact electrode and a second contact electrode.

3. The light-emitting device according to claim 2, wherein the first insulating layer opening exposes the first contact electrode and the second insulating layer opening exposes the second contact electrode.

4. The light-emitting device according to claim 2, wherein the first contact electrode directly contacts the first semiconductor layer of the first light-emitting unit and the second contact electrode is formed on the second semiconductor layer of the second light-emitting unit.

5. The light-emitting device according to claim 4, further comprising a current blocking layer formed between the second contact electrode and the second semiconductor layer of the second light-emitting unit.

6. The light-emitting device according to claim 5, further comprising a conductive layer formed between the current blocking layer and the second contact electrode of the second light-emitting unit, wherein the conductive layer comprises a transparent conductive layer.

7. The light-emitting device according to claim 2, further comprising a trench formed between the plurality of light-emitting units and wherein the trench exposes the top surface of the substrate.

8. The light-emitting device according to claim 7, wherein the plurality of connecting electrodes each comprises a first electrical connecting portion electrically connected to the first semiconductor layer, a bridge connecting portion on the trench, and a second electrical connecting portion electrically connected to the second semiconductor layer.

9. The light-emitting device according to claim 1, wherein the insulating layer comprises a Distributed Bragg Reflector (DBR) structure.

10. The light-emitting device according to claim 1, wherein the first extension electrode covers a first group of the plurality of light-emitting units, and the second extension electrode covers a second group of the plurality of light-emitting units; and wherein the first group of the plurality of light-emitting units comprises a same amount as the second group of the plurality of light-emitting units.

11. The light-emitting device according to claim 1, further comprising a first metal layer covering the first light-emitting unit and a second metal layer covering the second light-emitting unit, wherein the first metal layer and the second metal layer are electrically insulated from the plurality of light-emitting units by the insulating layer.

12. The light-emitting device according to claim 11, further comprising a first electrode pad covering the first light-emitting unit and a second electrode pad covering the second light-emitting unit, wherein the first electrode pad covers the first metal layer and the second electrode pad covers the second metal layer.

13. The light-emitting device according to claim 11, wherein in a top view of the light-emitting device, the first metal layer comprises a first metal surface area larger than a first extension surface area of the first extension electrode, or the second metal layer comprises a second metal surface area larger than a second extension surface area of the second extension surface area of the second extension electrode.

14. The light-emitting device according to claim 1, further comprising a conductive layer formed on the second semiconductor layer of each of the plurality of light-emitting units, and a metal reflective layer formed on the conductive layer.

15. The light-emitting device according to claim 1, further comprising a first electrode pad covering the first light-emitting unit and a second electrode pad covering the second light-emitting unit.

16. The light-emitting device according to claim 15, further comprising a protective layer comprising a first protective layer opening formed on the first light-emitting unit and a second protective layer opening formed on the second light-emitting unit.

17. The light-emitting device according to claim 16, wherein the first electrode pad covers the first protective layer opening to contact the first extension electrode and the second electrode pad covers the second protective layer opening to contact the second extension electrode.

18. The light-emitting device according to claim 15, wherein the first electrode pad covers the first extension electrode and the second electrode pad covers the second extension electrode.

19. The light-emitting device according to claim 15, wherein the first electrode pad and the second electrode pad do not cover the plurality of connecting electrodes.

20. The light-emitting device according to claim 1, wherein the plurality of light-emitting units each comprises a plurality of recesses and a semiconductor mesa, the semiconductor mesa is surrounded by the plurality of recesses, each of the plurality of recesses exposes a surface of the first semiconductor layer, and wherein each of the plurality of opening structures further comprises a plurality of first insulating layer openings, the plurality of the first insulating layer openings is formed on the plurality of recesses.

* * * * *